United States Patent
Yan et al.

(10) Patent No.: US 12,543,438 B2
(45) Date of Patent: Feb. 3, 2026

(54) DISPLAY DEVICE, DISPLAY PANEL AND MANUFACTURING METHOD THEREOF, DRIVING CIRCUIT AND DRIVING METHOD

(71) Applicant: BOE Technology Group Co., Ltd., Beijing (CN)

(72) Inventors: Huajie Yan, Beijing (CN); Xiaohu Li, Beijing (CN); Zhiqiang Jiao, Beijing (CN); Lu Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 983 days.

(21) Appl. No.: 17/629,739

(22) PCT Filed: Mar. 24, 2021

(86) PCT No.: PCT/CN2021/082837
§ 371 (c)(1),
(2) Date: Jan. 24, 2022

(87) PCT Pub. No.: WO2022/160440
PCT Pub. Date: Aug. 4, 2022

(65) Prior Publication Data
US 2023/0165051 A1  May 25, 2023

(30) Foreign Application Priority Data
Jan. 26, 2021 (CN) .......................... 202110101413.9

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/122* (2023.02);
(Continued)

(58) Field of Classification Search
CPC ...... H10K 59/32; H10K 59/12; H10K 59/353; H10K 50/19; H10K 50/81; H10K 50/82; G09G 3/325
See application file for complete search history.

(56) References Cited

U.S. PATENT DOCUMENTS 5,703,436 A 12/1997 Forrest et al.
6,596,134 B2 7/2003 Forrest et al.
(Continued)

FOREIGN PATENT DOCUMENTS

CN 1215500 A 4/1999
CN 1665360 A 9/2005
(Continued)

OTHER PUBLICATIONS

Non-Final Office Action issued in U.S. Appl. No. 17/630,906 dated Aug. 2, 2024, (9p).
(Continued)

*Primary Examiner* — Priyank J Shah
(74) *Attorney, Agent, or Firm* — Arch & Lake LLP

(57) ABSTRACT

The present disclosure relates to a display device, a display panel and a manufacturing method thereof. The display panel includes a driving backplane and a light emitting device layer, and the driving backplane includes multiple pixel driving circuits, the light emitting device layer includes multiple light emitting units distributed in an array, the light emitting unit includes multiple light emitting devices stacked in a direction away from the driving backplane, and light emitting devices other than a light emitting device closest to the driving backplane in a direction perpendicular to the driving backplane are transparent devices; and in the same light emitting unit, at least part of the light emitting devices are coupled to the pixel driving circuits for emitting light under driving of the pixel driving circuits, and
(Continued)

at least two light emitting devices in the same light emitting unit have different light emitting materials.

18 Claims, 17 Drawing Sheets

(51) Int. Cl.
    *H10K 59/122*     (2023.01)
    *H10K 59/18*     (2023.01)
    *H10K 59/32*     (2023.01)
    *H10K 59/35*     (2023.01)
    *H10K 59/80*     (2023.01)
    *H10K 71/00*     (2023.01)

(52) U.S. Cl.
    CPC ............ *H10K 59/18* (2023.02); *H10K 59/32* (2023.02); *H10K 59/353* (2023.02); *H10K 59/8792* (2023.02); *H10K 71/00* (2023.02)

(56) References Cited

U.S. PATENT DOCUMENTS

| | | | |
|---|---|---|---|
| 7,173,369 | B2 | 2/2007 | Forrest et al. |
| 8,324,803 | B2 | 12/2012 | Forrest et al. |
| 8,680,693 | B2 | 3/2014 | Kang et al. |
| 9,082,735 | B1 | 7/2015 | Sundararajan |
| 9,570,532 | B2 | 2/2017 | Huangfu et al. |
| 9,761,166 | B2 | 9/2017 | Gu et al. |
| 9,865,668 | B2 | 1/2018 | Sato |
| 10,147,361 | B2 | 12/2018 | Gu et al. |
| 10,157,573 | B2 | 12/2018 | Pappas et al. |
| 10,193,104 | B2 | 1/2019 | Xu et al. |
| 10,396,135 | B2 | 8/2019 | Hsu |
| 10,566,404 | B2 | 2/2020 | Sato |
| 10,651,259 | B2 | 5/2020 | Sato |
| 10,673,005 | B2 | 6/2020 | Park et al. |
| 10,916,192 | B2 | 2/2021 | Pappas et al. |
| 2002/0153243 | A1 | 10/2002 | Forrest et al. |
| 2003/0213967 | A1 | 11/2003 | Forrest et al. |
| 2004/0263499 | A1* | 12/2004 | Tanada ............... G09G 3/30 345/204 |
| 2007/0132369 | A1 | 6/2007 | Forrest et al. |
| 2009/0009101 | A1* | 1/2009 | Kang ............... H10K 59/32 315/250 |
| 2010/0187988 | A1 | 7/2010 | Forrest et al. |
| 2014/0167011 | A1 | 6/2014 | Huangfu et al. |
| 2015/0255012 | A1 | 9/2015 | Gu et al. |
| 2016/0315133 | A1 | 10/2016 | Sato |
| 2017/0294624 | A1 | 10/2017 | Xu et al. |
| 2017/0309224 | A1 | 10/2017 | Pappas et al. |
| 2017/0330517 | A1 | 11/2017 | Gu et al. |
| 2018/0090551 | A1 | 3/2018 | Sato |
| 2018/0331164 | A1 | 11/2018 | Hsu |
| 2019/0027094 | A1 | 1/2019 | Pappas et al. |
| 2019/0157369 | A1 | 5/2019 | Sato |
| 2019/0198788 | A1* | 6/2019 | Park ............... H10K 50/19 |
| 2019/0259132 | A1 | 8/2019 | Miyasaka et al. |
| 2020/0212119 | A1 | 7/2020 | Shim et al. |
| 2020/0235184 | A1 | 7/2020 | Sato |
| 2021/0134220 | A1 | 5/2021 | Pappas et al. |
| 2022/0158059 | A1 | 5/2022 | Jin et al. |
| 2022/0209157 | A1* | 6/2022 | Lee ............... H10K 59/38 |

FOREIGN PATENT DOCUMENTS

| | | |
|---|---|---|
| CN | 101127194 A | 2/2008 |
| CN | 101371619 A | 2/2009 |
| CN | 102034934 A | 4/2011 |
| CN | 101127194 B | 5/2011 |
| CN | 103021334 A | 4/2013 |
| CN | 104716264 A | 6/2015 |
| CN | 104813488 A | 7/2015 |
| CN | 105493307 A | 4/2016 |
| CN | 106067473 A | 11/2016 |
| CN | 104716264 B | 2/2017 |
| CN | 107946343 A | 4/2018 |
| CN | 109257943 A | 1/2019 |
| CN | 109416900 A | 3/2019 |
| CN | 110428778 A | 11/2019 |
| CN | 111370448 A | 7/2020 |
| CN | 1000370448 A | 7/2020 |
| EP | 0885451 B1 | 2/1997 |
| EP | 0885451 A1 | 9/1997 |
| EP | 1974590 A1 | 10/2008 |
| EP | 1974590 B1 | 10/2008 |
| EP | 2743909 A1 | 6/2014 |
| EP | 2743909 B1 | 5/2018 |
| EP | 3357056 A2 | 8/2018 |
| EP | 3437146 A1 | 2/2019 |
| EP | 3675175 A1 | 7/2020 |
| GB | 2549734 A | 11/2017 |
| GB | 2549734 B | 11/2017 |
| JP | 2006302506 A | 11/2006 |
| KR | 20090039139 A | 4/2009 |
| KR | 100941591 B1 | 2/2010 |
| KR | 20140140861 A | 12/2014 |
| KR | 20180078641 A | 7/2018 |
| WO | 9733296 A1 | 9/1997 |
| WO | 2007083918 A1 | 7/2007 |
| WO | 2014106335 A1 | 7/2014 |
| WO | 2016025824 A1 | 2/2016 |
| WO | 2017070892 A1 | 5/2017 |
| WO | 2017189578 A2 | 11/2017 |
| WO | 2017189578 A3 | 11/2017 |
| WO | 2018205734 A1 | 11/2018 |
| WO | 2021027514 A1 | 2/2021 |

OTHER PUBLICATIONS

Written Opinion of International Application No. PCT/CN2021/082837 dated Nov. 4, 2021, (4p).

Written Opinion of International Application No. PCT/CN2021/082838 dated Oct. 18, 2021, (4p).

First Office Action issued in Chinese Application No. 202110101413.9 dated Apr. 2, 2022 with English translation, (16p).

* cited by examiner

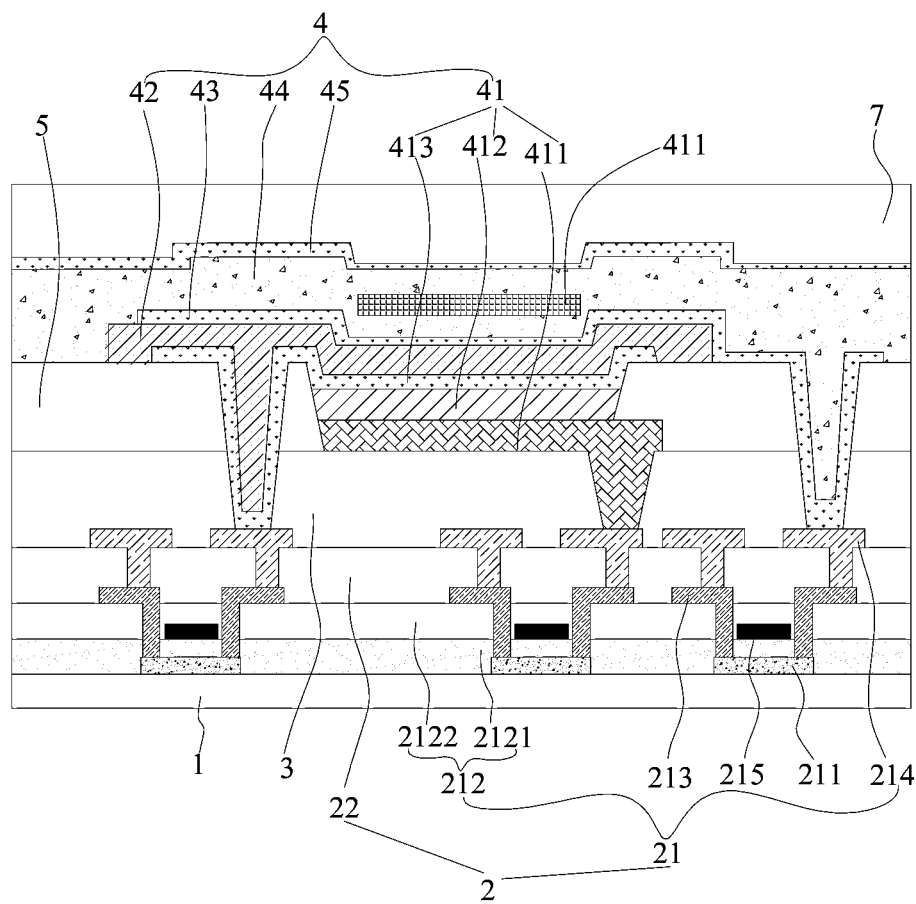

FIG. 25

| a driving backplane, including multiple pixel driving circuits | ⌒S110 |

| a light emitting device layer, including multiple light emitting units distributed in an array, wherein the light emitting unit includes multiple light emitting devices stacked in a direction away from the driving backplane; light emitting devices other than the light emitting device closest to the driving backplane in a direction perpendicular to the driving backplane are transparent devices; and in the same light emitting unit, at least part of the light emitting devices are coupled to the pixel driving circuits for emitting light under driving of the pixel driving circuits, and at least two light emitting devices in the same light emitting unit have different light emitting materials | ⌒S120 |

FIG. 26

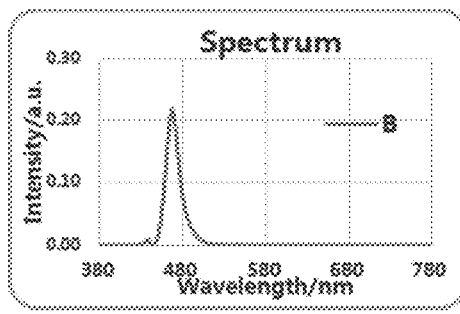

FIG. 33

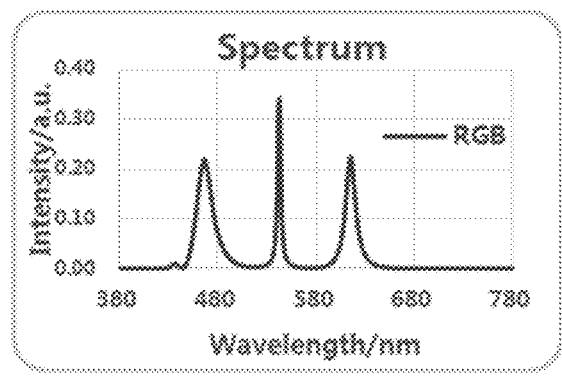

FIG. 34

| in a data writing stage, turning on a data writing unit to transmit a data signal to a control terminal of a driving transistor through the data writing unit and the driving transistor, and to charge an energy storage unit | S210 |

| in a light emitting stage, inputting an electrical signal to the driving transistor to turn on the driving transistor by the energy storage unit ; inputting a first power signal to a first terminal of a first light emitting device through a first power terminal and inputting a first signal through a first signal input terminal to control the first light emitting device to emit light; inputting a second signal to a second signal input terminal and inputting a third signal to the first signal input terminal to control a second light emitting device to emit light; and inputting a fourth signal to the second signal input terminal and inputting a second power signal to a second power terminal to control a third light emitting device to emit light | S220 |

FIG. 35

DISPLAY DEVICE, DISPLAY PANEL AND MANUFACTURING METHOD THEREOF, DRIVING CIRCUIT AND DRIVING METHOD

CROSS-REFERENCE

This application is the 371 application of PCT Application No. PCT/CN2021/082837, filed on Mar. 24, 2021, which is based upon and claims the priority to the Chinese Patent Application NO. 202110101413.9, entitled "DISPLAY DEVICE, DISPLAY PANEL AND MANUFACTURING METHOD THEREOF", filed on Jan. 26, 2021, the entire contents of which are hereby incorporated by reference.

TECHNICAL FIELD

The present disclosure relates to the field of display technologies, and in particular, to a display device, a display panel and a manufacturing method thereof, a driving circuit and a driving method.

BACKGROUND

With the development of display technologies, organic light emitting diode (OLED) display panels are widely used in the display technologies due to their advantages of lightness, thinness, high contrast, flexibility, short response time, etc.

It should be noted that the information disclosed in the Background section above is only for enhancing the understanding of the background of the present disclosure, and thus may include information that does not constitute prior art known to those of ordinary skill in the art.

SUMMARY

An objective of the present disclosure is to provide a display device, a display panel and a manufacturing method thereof, a driving circuit and a driving method.

According to an aspect of the present disclosure, there is provided a display panel including:
  a driving backplane, including multiple pixel driving circuits; and
  a light emitting device layer, including multiple light emitting units distributed in an array, wherein the light emitting unit includes multiple light emitting devices stacked in a direction away from the driving backplane, and light emitting devices other than a light emitting device closest to the driving backplane in a direction perpendicular to the driving backplane are transparent devices; and
  in the same light emitting unit, at least part of the light emitting devices are coupled to the pixel driving circuits for emitting light under driving of the pixel driving circuits, and at least two light emitting devices in the same light emitting unit have different light emitting materials.

According to an aspect of the present disclosure, there is provided a display device including the display panel in any one of the embodiments described above.

According to an aspect of the present disclosure, there is provided a manufacturing method for a display panel, including:
  forming a driving backplane including multiple pixel driving circuits; and
  forming a light emitting device layer on a side of the driving backplane, wherein the light emitting device layer includes multiple light emitting units distributed in an array, wherein the light emitting unit includes multiple light emitting devices stacked in a direction away from the driving backplane, and light emitting devices other than the light emitting device closest to the driving backplane in a direction perpendicular to the driving backplane are transparent devices;
  wherein in the same light emitting unit, at least part of the light emitting devices are coupled to the pixel driving circuits for emitting light under driving of the pixel driving circuits, and at least two light emitting devices in the same light emitting unit have different light emitting materials.

According to an aspect of the present disclosure, there is provided a pixel driving circuit configured to drive multiple light emitting devices connected in series between a first power terminal and a second power terminal, and the pixel driving circuit includes:
  a driving transistor having a control terminal, a first terminal and a second terminal, wherein the second terminal of the driving transistor is configured to be coupled to a first terminal of a light emitting device;
  a data writing unit, configured to be turned on in response to a writing control signal to transmit a data signal to the first terminal of the driving transistor; and
  an energy storage unit, wherein a first terminal of the energy storage unit is coupled to the first power terminal, and a second terminal of the energy storage unit is coupled to the control terminal of the driving transistor;
  wherein a signal input terminal is coupled between two adjacent light emitting devices.

According to an aspect of the present disclosure, there is provided a driving method for a pixel driving circuit, which is applied to the pixel driving circuit in any one of the embodiments described above;
  the driving method includes:
  in a data writing stage, turning on the data writing unit to transmit the data signal to the control terminal of the driving transistor through the data writing unit and the driving transistor, and to charge the energy storage unit; and
  in a light emitting stage, inputting an electrical signal to the driving transistor to turn on the driving transistor by the energy storage unit; inputting a first power signal to the first terminal of the first light emitting device through the first power terminal and inputting a first signal through the first signal input terminal to control the first light emitting device to emit light; inputting a second signal to the second signal input terminal and inputting a third signal to the first signal input terminal to control the second light emitting device to emit light; and inputting a fourth signal to the second signal input terminal and inputting a second power signal to the second power terminal to control the third light emitting device to emit light It should be noted that the above general description and the following detailed description are merely exemplary and explanatory and should not be construed as limiting of the disclosure.

BRIEF DESCRIPTION OF THE DRAWINGS

The accompanying drawings here, which are incorporated in and constitute a part of this disclosure, illustrate embodiments consistent with the present disclosure and, together with the description, serve to explain the principles of the present disclosure. Obviously, the drawings in the following description are only some embodiments of the present disclosure. For those of ordinary skill in the art, other drawings can be obtained based on these drawings without creative work.

FIG. 25 is a schematic diagram of an encapsulation layer according to an embodiment of the present disclosure.

FIG. 26 is a flowchart of a manufacturing method for a display panel according to an embodiment of the present disclosure.

FIG. 33 is a spectrum of a first light emitting device (B) according to an embodiment of the present disclosure.

FIG. 34 is a RGB spectrum of a pixel driving circuit according to an embodiment of the present disclosure.

FIG. 35 is a flowchart of a driving method for a pixel driving circuit according to an embodiment of the present disclosure.

DETAILED DESCRIPTION

Figure 1:
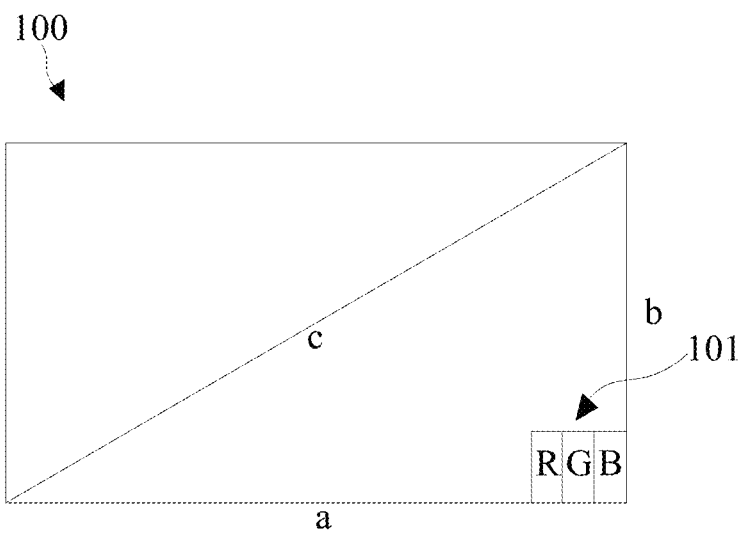
FIG. 1 is a schematic diagram of a tiled display panel in the related art.

Exemplary embodiments will now be described more fully with reference to the accompanying drawings. However, the exemplary embodiments can be implemented in a variety of forms and should not be construed as being limited to the examples set forth herein; rather, these embodiments are provided so that the present disclosure will be more full and complete so as to convey the idea of the exemplary embodiments to those skilled in this art. The same reference signs in the drawings denote the same or similar structures, and the detailed description thereof will be omitted. In addition, the drawings are merely schematic representations of the present disclosure and are not necessarily drawn to scale.

Although relative terms such as "above" and "below" are used in this specification to describe a relative relationship of one component to another component shown, these terms are only for convenience in this specification, for example, according to an exemplary direction shown in the drawings. It will be understood that if a device shown is flipped upside down, a component described "above" will become the component "below". When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" "third" and "fourth" etc. are used only as markers, and do not limit the number of objects.

In the related art, a display panel 100 mainly includes a driving backplane and multiple light emitting units tiled on a side of the driving backplane and distributed in an array. In order to realize full-color display, three tiled sub-pixels are typically used to form one pixel 101, resulting in low utilization of a display area. As shown in FIG. 1, a is a length of the display panel 100, b is a width of the display panel 100, and c is a diagonal length of the display panel 100, a resolution of the pixel 101 is $$PPi = \frac{\sqrt{a^2 + b^2}}{c}.$$

In addition, during a manufacturing process, due to limitations of a process limit of a fine mask for evaporation, the PPi of the common display panel 100 is about 600, and the display resolution is relatively low.

Figure 2:
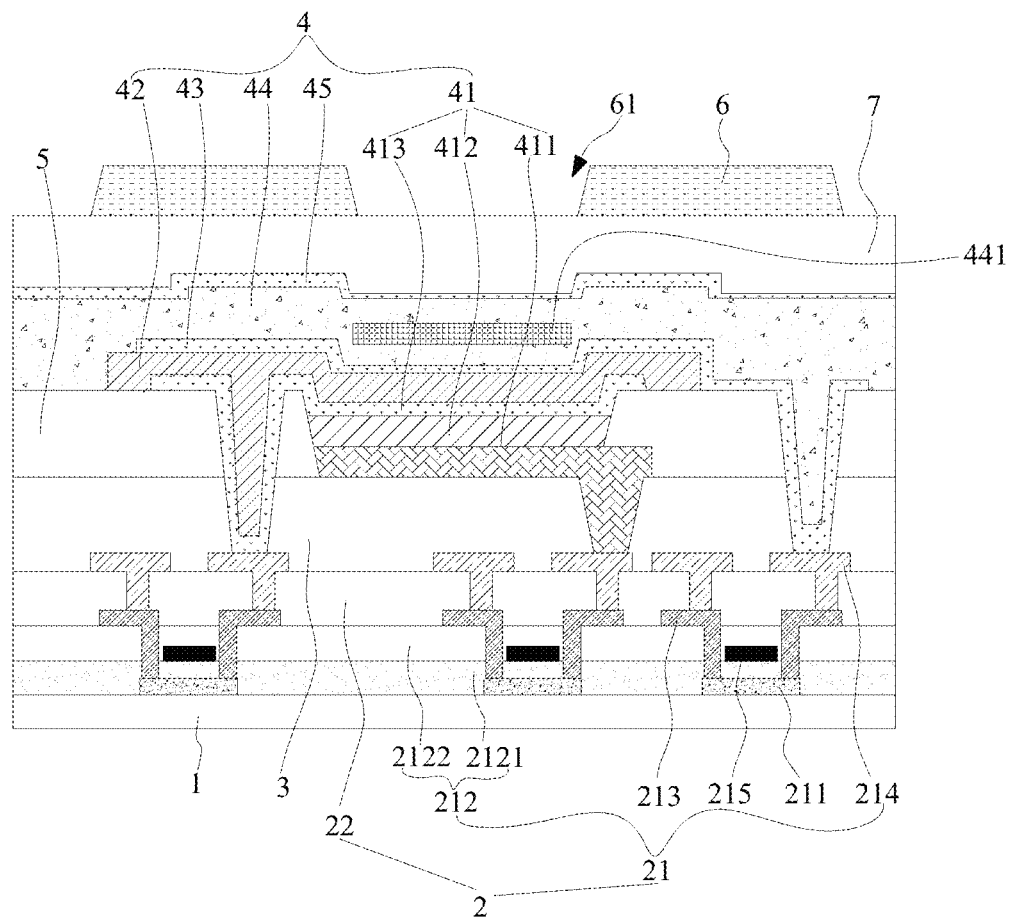
FIG. 2 is a schematic diagram of a display panel according to an embodiment of the present disclosure.
Figure 3:
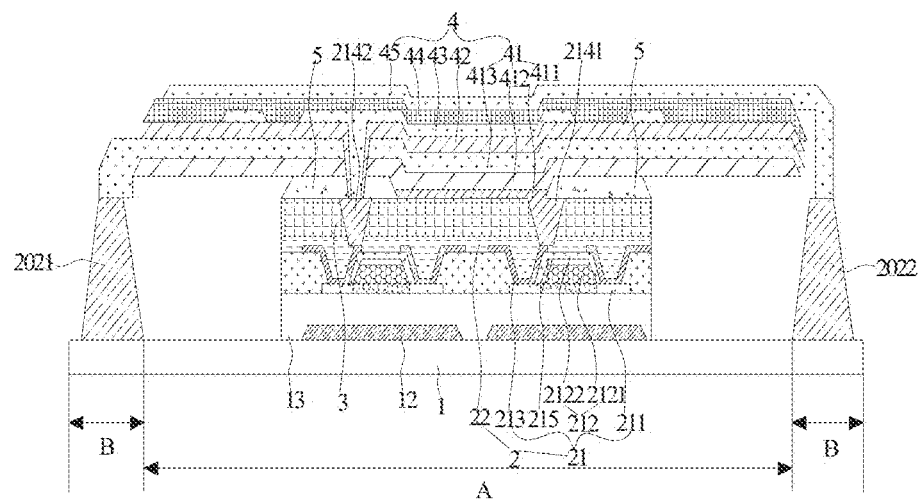
FIG. 3 is a schematic diagram of a display panel according to an embodiment of the present disclosure.

Embodiments of the present disclosure provide a display panel, and the display panel may be an active-matrix organic light emitting diode (AMOLED) display panel. As shown in FIGS. 2 to 3, the display panel may include a driving backplane 2 and a light emitting device layer 4.

The driving backplane 2 includes multiple pixel driving circuits 21;
 the light emitting device layer 4 includes multiple light emitting units distributed in an array, the light emitting unit includes multiple light emitting devices 41 stacked in a direction away from the driving backplane 2, and light emitting devices 41 other than the light emitting device 41 closest to the driving backplane 2 in a direction perpendicular to the driving backplane 2 are transparent devices; and
 in the same light emitting unit, at least part of the light emitting devices 41 are coupled to the pixel driving circuits 21 for emitting light under driving of the pixel driving circuits 21, and at least two light emitting devices 41 in the same light emitting unit have different light emitting materials.

In the display panel of the present disclosure, the multiple light emitting devices 41 are stacked, which can increase the number of light emitting devices 41 in each light emitting unit, thereby increasing the number of light emitting devices 41 in a display region and improving utilization of the display region; in addition, since the at least two light emitting devices 41 in the same light emitting unit have the different light emitting materials so as to emit light of multiple colors, the light of multiple colors can be superimposed to achieve full color, thereby doubling the display resolution; in this process, since the pixel driving circuit 21 is coupled to the light emitting device 41, individual light emitting devices 41 can be driven separately through respective pixel driving circuits 21, so that individual light emitting devices 41 emit light independently without interfering with each other; in addition, since the light emitting devices 41 other than the light emitting device 41 closest to the driving backplane 2 in the direction perpendicular to the driving backplane 2 are the transparent devices, the light emitted by each light emitting device 41 can exit in a direction away from the driving backplane 2 to avoid the light irradiating to the pixel driving circuit 21, thereby ensuring stability of the pixel driving circuit 21.

FIGS. 2 to 3 show schematic structural diagrams of a display panel according to an embodiment of the present disclosure, and a light emitting principle of the display panel in the embodiments of the present disclosure will be described below in conjunction with FIGS. 2 to 3. The display panel mainly includes the driving backplane 2 and the light emitting device layer 4, and the driving backplane 2 can be disposed on a side of a substrate 1. The driving backplane 2 can include a pixel region A and an edge region B located outside the pixel region A, and the edge region B can be a ring-shaped region around a periphery of the pixel region A, or may also be an open region located on both sides of the pixel region A, which is not specifically limited herein. The driving backplane 2 may include a pixel driving layer including the multiple pixel driving circuits 21 arranged side by side, and each pixel driving circuit 21 can be located in the pixel region A, as shown in FIG. 3, where wavy lines in blank regions in the figure represent that multiple light emitting units are omitted here, and a structure of each omitted light emitting unit is the same as a structure of a light emitting unit shown between the wavy lines on both sides. In addition, the edge region can be provided with multiple peripheral circuits, and each peripheral circuit can work independently without interfering with each other.

As shown in FIGS. 2 and 3, the light emitting device layer 4 is disposed on a side of the pixel driving layer away from the substrate 1, and includes the multiple light emitting units distributed in an array. Each light emitting unit can be located in the pixel region A, and each light emitting unit includes the multiple light emitting devices 41 stacked in the direction away from the driving backplane 2. Individual light emitting devices 41 have different light emitting materials and can respectively emit light of different colors. In the same light emitting unit, at least part of the light emitting devices 41 are coupled to the pixel driving circuits 21, and individual light emitting devices 41 can be powered on through respective pixel driving circuits 21. The individual light emitting devices 41 can be controlled in a timing sequence manner to emit light independently, so as to display an image. In some embodiments, the multiple light emitting devices 41 in the same light emitting unit can be simultaneously powered on, and can be controlled to simultaneously emit the light, so that the light of multiple colors can be superimposed, which can increase the utilization of the display region and increase the resolution of the display region.

In some embodiments of the present disclosure, the substrate 1 may be a flat plate structure, and may be made of a hard material such as glass or a flexible material such as polyimide (PI). The substrate 1 may be a single-layer or multi-layer structure, which is not specifically limited herein.

As shown in FIGS. 2 to 3, the pixel driving circuit 21 may include a transistor, which may be electrically coupled to the light emitting device 41, so that each light emitting device 41 is controlled by each transistor to display the image, and in this process, each light emitting device 41 emits the light independently without interfering with each other. The transistor can be a low temperature poly-silicon (LTPS) transistor or a low temperature poly oxide (LTPO) transistor, which is not specifically limited herein.

The transistor may include an active layer 211, a gate insulating layer 212, a gate 215 and a first source-drain layer 213. The gate insulating layer 212 may include a first gate insulating layer 2121 and a second gate insulating layer 2122. An active region can be doped multiple times to form the active layer 211 that may be located on a side of the substrate 1 close to the light emitting device layer 4. The first gate insulating layer 2121 covers the active layer 211; the gate 215 is disposed on a side of the first gate insulating layer 2121 away from the substrate 1; and the second gate insulating layer 2122 covers the gate 215 and the first gate insulating layer 2121. A hole can be formed in the first gate insulating layer 2121 and the second gate insulating layer 2122 to form a via hole coupled to the active region. An orthographic projection of the via hole on the substrate 1 does not overlap with an orthographic projection of the gate 215 on the substrate 1. The first source-drain layer 213 is formed on a side of the second gate insulating layer 2122 away from the substrate 1 and includes a source and a drain. The source and the drain can be coupled to both ends of the active layer 211 through via holes penetrating the second gate insulating layer 2122 and/or the first gate insulating layer 2121.

Figure 4:
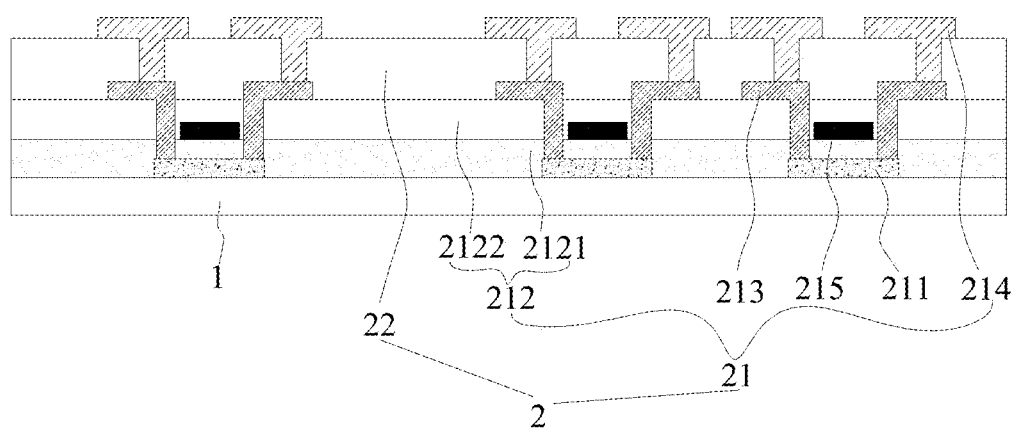
FIG. 4 is a schematic diagram of a driving backplane according to an embodiment of the present disclosure.

In addition, in some embodiments of the present disclosure, as shown in FIG. 4, the driving backplane 2 may further include a protective layer 22 covering the first source-drain layer 213, and the protective layer 22 can cover a surface of the first source-drain layer 213 away from the substrate 1 and can be used to prevent hydrogen plasmas generated in subsequent processes from diffusing to each transistor.

In some embodiments of the present disclosure, the driving backplane 2 may further include a second source-drain layer 214 that may be formed on a side of the protective layer 22 away from the substrate 1, and a hole can be formed in the protective layer 22 to form a via hole for coupling the first source-drain layer 213, the second source-drain layer 214 can be coupled to the first source-drain layer 213 of the transistor through the via hole penetrating the protective layer 22.

Figure 5:
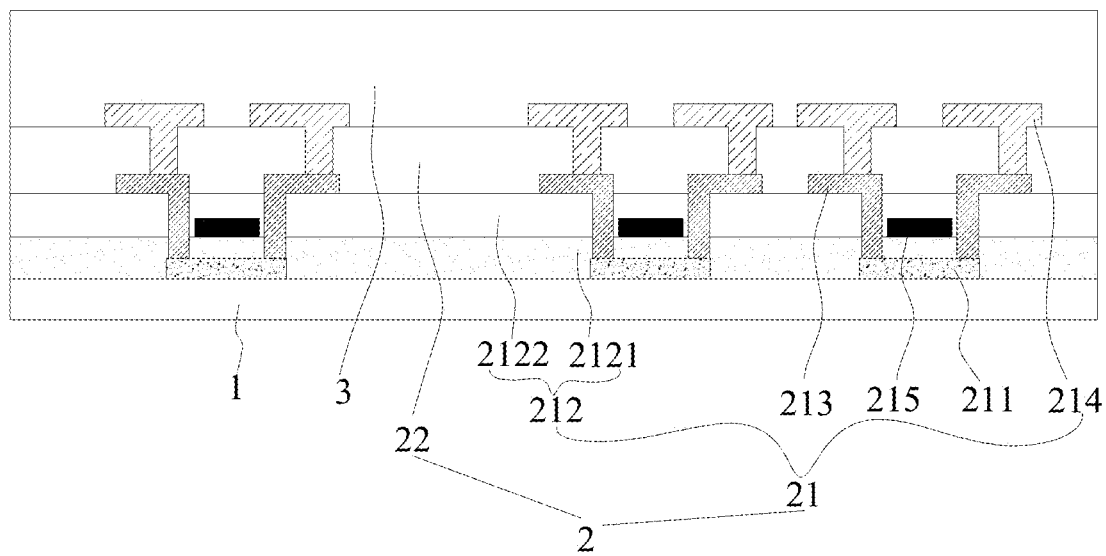
FIG. 5 is a schematic diagram of a planarization layer according to an embodiment of the present disclosure.

As shown in FIG. 5, the display panel of the present disclosure may further include a planarization layer 3 that may be disposed on the side of the protective layer 22 away from the substrate 1, so as to provide a relatively flat reference for the subsequent processes. When the driving backplane 2 includes the second source-drain layer 214, the planarization layer 3 can cover the protective layer 22 and the second source-drain layer 214 to eliminate a device gap (or height offset) of the second source-drain layer 214.

In some embodiments of the present disclosure, the driving backplane 2 may further include a first light shielding layer 12 and a buffer layer 13.

The first light shielding layer 12 may be located between the driving backplane 2 and the substrate 1. As shown in FIG. 3, the first light shielding layer 12 may be located on a surface of the substrate 1 close to the driving backplane 2, and the first light shielding layer 12 can be used to prevent ambient light from being incident on the active layer 31 of the transistor to protect stability of the transistor.

In some embodiments, vacuum evaporation, magnetron sputtering, chemical vapor deposition, physical vapor deposition or the like may be used to form the first light shielding layer 12 on a side of the substrate 1 close to the driving backplane 2. By way of example, a photolithography process can be used to form the first light shielding layer 12, a light shielding film layer can be deposited on the side of the substrate 1 close to the driving backplane 2, and a photoresist is formed on a side of the light shielding film layer away from the substrate 1 and is exposed and developed through a mask to form a developing region. A pattern of the developing region can be the same as a pattern required by the first light shielding layer 12, and its size can be the same as a size of the pattern required by the first light shielding layer 12. The light shielding film layer can be anisotropically etched in the developing region to form the first light shielding layer 12, and finally the remaining photoresist on a surface of the first light shielding layer can be stripped to expose the first light shielding layer 12 formed by photolithography.

The buffer layer 13 may be located on a side of the first light shielding layer 12 away from the substrate 1, and may be formed on a surface of the first light shielding layer 12 away from the substrate 1 by using a process such as the chemical vapor deposition, the physical vapor deposition or atomic layer deposition. The buffer layer 13 can be used to block impurities in the substrate 1 from diffusing into the driving backplane 2 to protect the stability of the driving backplane 2. In some embodiments, the pixel driving layer may be formed on a surface of the buffer layer 13 away from the substrate 1.

In some embodiments of the present disclosure, individual light emitting devices 41 in the same light emitting unit can be stacked in the direction perpendicular to the driving backplane 2. Each light emitting device 41 can emit light of one color, and the individual light emitting devices 41 in the same light emitting unit can emit light of multiple different colors, the light emitted by the individual light emitting devices 41 in the direction perpendicular to the driving backplane 2 can be superimposed together. The individual light emitting devices 41 can be controlled in the timing sequence manner to emit light independently, thereby realizing the control of the luminous color.

In some embodiments, the number of light emitting devices 41 in the same light emitting unit can be two or three. In an embodiment, the number of light emitting devices 41 in the same light emitting unit is three, which are a first light emitting device, a second light emitting device and a third light emitting device, respectively. The first light emitting device is located on the side of the pixel driving layer away from the substrate 1, the second light emitting device is located on a surface of the first light emitting device away from the substrate 1, and the third light emitting device is located on a surface of the second light emitting device away from the substrate 1, and the first light emitting device, the second light emitting device, and the third light emitting device are respectively coupled to different pixel driving circuits 21 in the driving backplane 2 in a one-to-one correspondence.

Light emitting materials of these three light emitting devices 41 may be different from each other, and different light emitting materials may be used to emit light of different colors, which may be any combination of RGB. In order to improve the resolution and equalize light intensities of the light emitted by individual light emitting devices 41, a light intensity of the light emitted by the light emitting device 41 close to the side of the driving backplane 2 in the direction perpendicular to the driving backplane 2 can be greater than a light intensity of the light emitted by the light emitting device 41 away from the side of the driving backplane 2 in the direction perpendicular to the driving backplane 2, and during the use, even if the light of the light-emitting device 41 located below is weakened due to transmittance, the overall display effect is not affected. In some embodiments, in the direction perpendicular to the driving backplane 2, a light intensity of the light emitted by the first light emitting device may be greater than a light intensity of the light emitted by the second light emitting device, and the light intensity of the light emitted by the second light emitting device may be greater than a light intensity of the light emitted by the third light emitting device.

It should be noted that the light emitted by these three light emitting devices 41 can also be the same, which can help prolong the service life of the light emitting devices.

Figure 6:
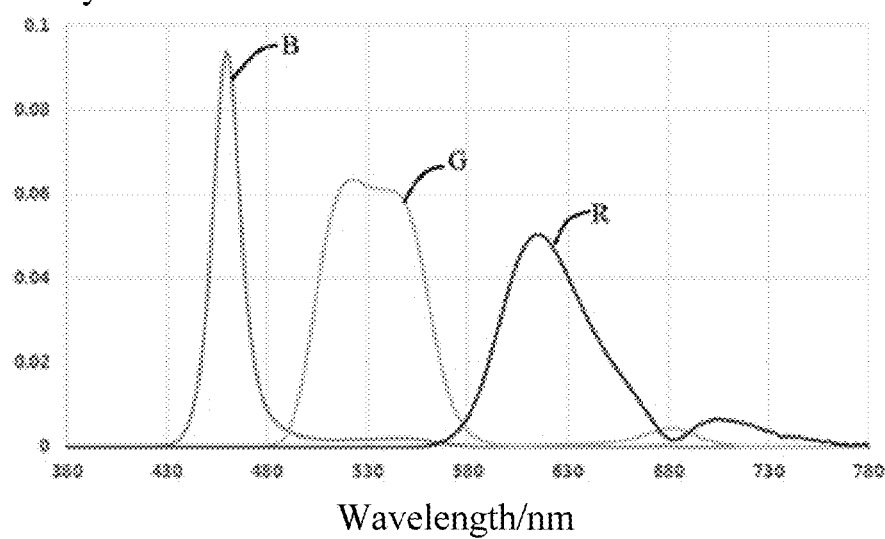
FIG. 6 is a schematic spectral diagram according to an embodiment of the present disclosure.
Figure 7:
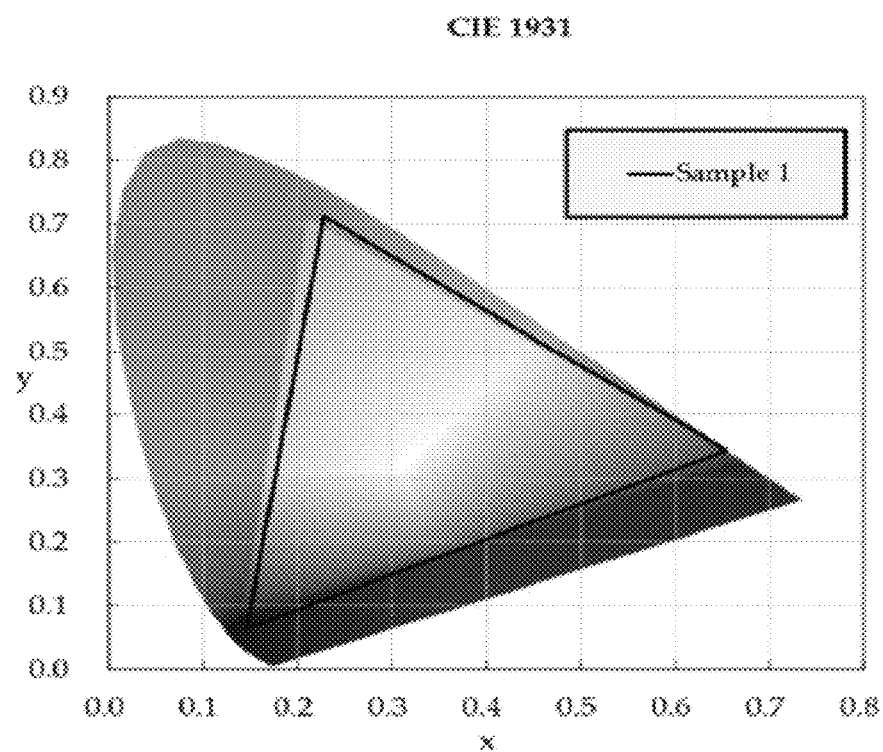
FIG. 7 is a schematic diagram of a color gamut of a display panel according to an embodiment of the present disclosure.

FIG. 6 shows a spectrum diagram of three colors of red, green, and blue. In the figure, an abscissa is a wavelength range, an ordinate is a light intensity, and peak positions in the curve are light intensities of the light of individual colors. It can be seen from the figure that a light intensity of blue light (B) is greater than that of green light (G), and the light intensity of the green light (G) is greater than that of red light (R), whereby a preferable solution is that a color of the light emitted by the first light emitting device is blue (B), a color of the light emitted by the second light emitting device is green (G), and a color of the light emitted by the third light emitting device is red (R), and the first light emitting device, the second light emitting device and the third light emitting device can emit the light at the same time, so that the display resolution can be increased by three times. FIG. 7 is a color gamut diagram of a display panel according to an embodiment of the present disclosure. In the figure, the abscissa and the ordinate are both chromaticity. After testing, the color gamut of the display panel in the embodiment is 96.8%.

In some embodiments of the present disclosure, the light emitting device 41 may include a first electrode layer 411, a light emitting functional layer 412, and a second electrode layer 413.

The first electrode layer 411 can be disposed on the side of the driving backplane 2, for example, it can be disposed on the side of the pixel driving layer away from the substrate 1, and can be coupled to the pixel driving circuit 21. The first electrode layer 411 can be used as an anode layer of the light emitting device 41, and its material can be a transparent conductive material or a light shielding material, which is not specifically limited herein. In some embodiments, the material can be ITO or AZO.

The light emitting functional layer 412 can be disposed on a surface of the first electrode layer 411 away from the driving backplane 2, and can provide a recombination place for excitons to emit light. The light emitting functional layer 412 can be a single-layer film layer or a multi-layer film layer, which is not specifically limited herein. Taking the multi-layer film layer as an example, the light emitting functional layer 412 can include a hole injection layer, a hole transport layer, an electron blocking layer, a light emitting layer, a hole blocking layer, an electron transport layer, and an electron injection layer.

The hole injection layer covers the surface of the first electrode layer 411 away from the driving backplane 2 to help enhance a hole injection capability of the devices. The hole transport layer covers a surface of the hole injection layer away from the first electrode layer 411, which can provide a transport channel for holes, improve a hole mobility, and help improve the luminous efficiency. The electron blocking layer covers a surface of the hole transport layer away from the first electrode layer 411, and can be used to block electrons from passing through the light emitting layer and moving towards the hole transport layer to avoid the recombination of electrons and holes in the hole transport layer, so as to ensure that a light emitting center is always located in the light emitting layer. The light emitting layer covers a surface of the electron blocking layer away from the first electrode layer 411, and the light emitting layer provides the recombination place for the electrons and the holes to emit the light. The hole blocking layer covers a surface of the light emitting layer away from the first electrode layer 411, and can be used to block the holes from passing through the light emitting layer and moving towards the electron transport layer to avoid the recombination of electrons and holes in the electron transport layer, so as to further ensure that the light emitting center is always located in the light emitting layer. The electron transport layer covers a surface of the hole blocking layer away from the first electrode layer 411, and can provide a transport channel for the electrons and improve an electron mobility. The electron injection layer covers a surface of the electron transport layer away from the first electrode layer 411, and can provide the transport channel for the electrons, improve the electron mobility and further improve the luminous efficiency. Each film layer in the light emitting functional layer 412 can be made of a transparent material, so as to increase a light transmittance and in turn increase a light extraction rate.

The second electrode layer 413 can be disposed on a surface of the light emitting functional layer 412 away from the driving backplane 2, and can be a metal oxide electrode, a metal electrode, a metal alloy electrode, or a composite electrode formed by a combination of the metal and the metal oxide, which is not specifically limited herein. The second electrode layer 413 can be used as a cathode layer of the light emitting device 41, and a voltage can be applied to the first electrode layer 411 and the second electrode layer 413 to make the light emitting functional layer 412 emit the light.

Figure 8:
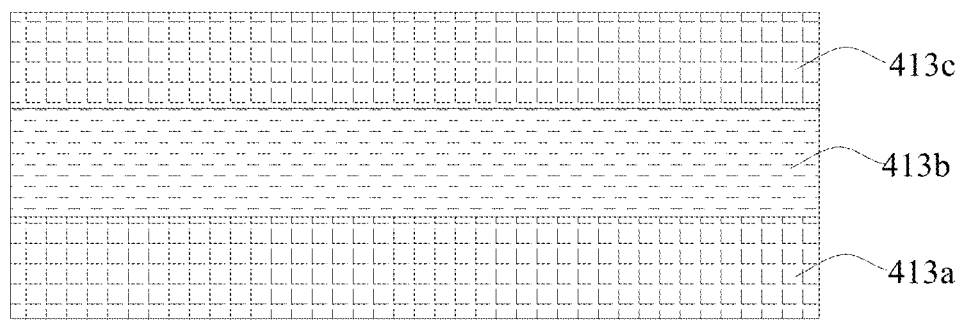
FIG. 8 is a schematic structural diagram of a second electrode layer according to an embodiment of the present disclosure.

In an embodiment of the present disclosure, a material of the second electrode layer 413 may be the IZO with a higher light transmittance, and the second electrode layer 413 may be formed on the surface of the light emitting functional layer 412 away from the first electrode layer 411 by a sputtering process. In another embodiment of the present disclosure, as shown in FIG. 8, the second electrode layer 413 includes a first electrode modification layer 413a, an electrode layer 413b, and a second electrode modification layer 413c that are stacked. The first electrode modification layer 413a is located on the surface of the light emitting functional layer 412 away from the driving backplane 2, the second electrode modification layer 413c is located on a side of the first electrode modification layer 413a away from the driving backplane 2, and the electrode layer 413b is located between the first electrode modification layer 413a and the second electrode modification layer 413c. A conductivity of the electrode layer 413b is greater than conductivities of the first electrode modification layer 413a and the second electrode modification layer 413c, and the first electrode modification layer 413a, the electrode layer 413b, and the second electrode modification layer 413c can form a DMD structure to improve the light transmittance. In some embodiments, the first electrode modification layer 413a, the electrode layer 413b, and the second electrode modification layer 413c may all be light transmitting materials. By way of example, the material of the first electrode modification layer 413a may be molybdenum oxide, the material of the electrode layer 413b may be aluminum-silver alloy, and the material of the second electrode modification layer can be molybdenum oxide. Note that, other light transmitting materials may also be possible, which will not be listed here.

In the same light emitting unit, among two adjacent light emitting devices 41 in the direction perpendicular to the driving backplane 2, a second electrode layer 413 of a light emitting device closer to the driving backplane 2 and a first electrode layer 411 of a light emitting device 41 away from the driving backplane 2 can be the same electrode layer, thereby reducing the number of electrodes in the light emitting unit and alleviating the decrease of the device efficiency due to an electrode transmittance.

In some embodiments of the present disclosure, the light emitting devices 41 other than the light emitting device 41 closest to the driving backplane 2 may be transparent light emitting devices, and a side of the light emitting device 41 closest to the driving backplane 2 that is close to the driving backplane 2 can have a light shielding design to ensure that the light emitted by all the light emitting devices 41 can exit in the direction away from the driving backplane 2, avoiding the light irradiating to the driving backplane 2, and ensuring the stability of the pixel driving circuits 21 in the driving backplane 2. It should be noted that the light emitting device 41 closest to the driving backplane 2 may also be the transparent device, which is not specifically limited herein.

Figure 9:
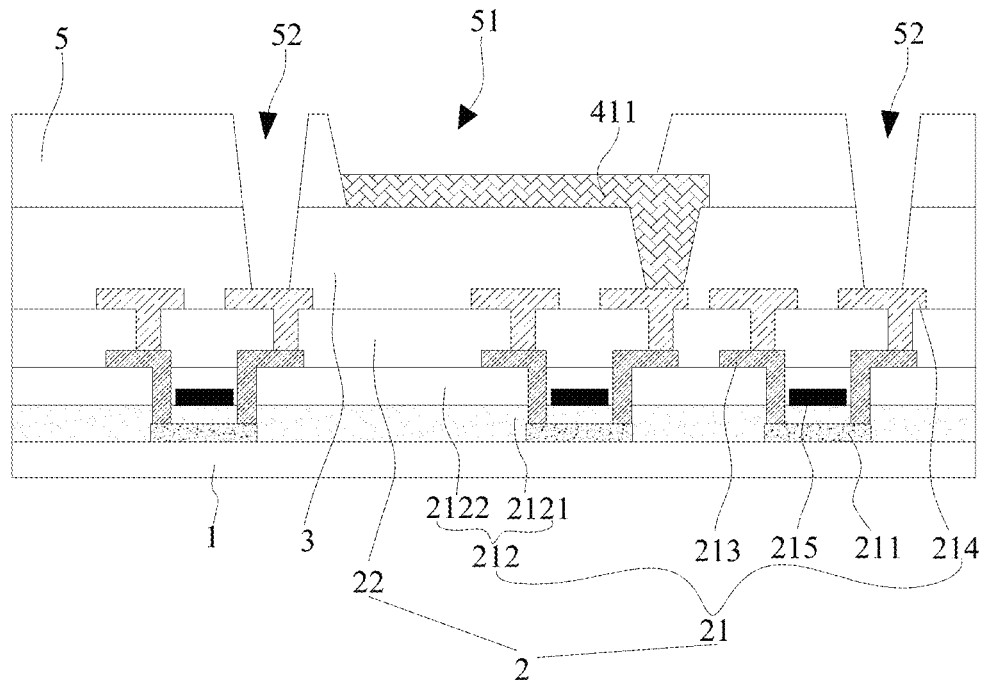
FIG. 9 is a schematic diagram of a pixel definition layer according to an embodiment of the present disclosure.
Figure 10:
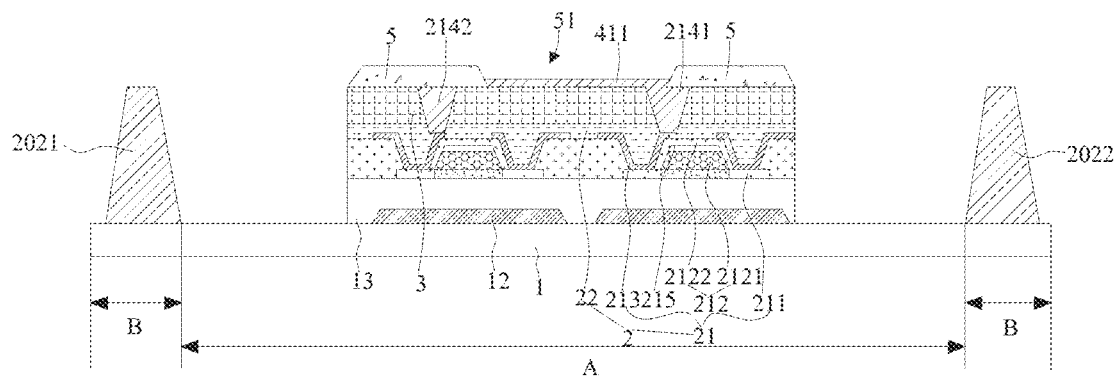
FIG. 10 is a schematic diagram of a driving backplane according to a second implementation of the present disclosure.

In order to define a range of each light emitting unit in the light emitting functional layer 412, the display panel of the present disclosure further includes a pixel definition layer 5. As shown in FIGS. 9 to 10, the pixel definition layer 5 may be disposed on the side of the driving backplane 2 and covers at least the pixel region A. In some embodiments, the pixel definition layer 5 may be located on the side of the pixel driving layer away from the substrate 1 and may be formed on a surface of the planarization layer 3 away from the substrate 1.

The first electrode layer 411 of the first light emitting device may be disposed on the same side of the driving backplane 2 as the pixel definition layer 5 and coupled to one of the pixel driving circuits 21. In some embodiments, as shown in FIG. 10, the display panel may further include connecting leads, and connecting leads may include a first lead 2141 and a second lead 2142 spaced apart, the first lead 2141 and the second lead 2142 can be coupled to different pixel driving circuits 21 through the via holes penetrating the planarization layer 3 and the protective layer 22, respectively. The first electrode layer 411 of the first light emitting device can be coupled to the first lead 2141, and in turn, the first electrode layer 411 of the first light emitting device can be coupled to the pixel driving circuit 21 through the first lead 2141. The second lead 2142 can be used to be coupled to electrodes of other light emitting devices in the same light emitting unit, so as to control other light emitting devices to emit the light. One light emitting unit can be provided with at least one corresponding first lead 2141 and at least one corresponding second lead 2142, and second leads 2142 in adjacent light emitting units can be arranged adjacently or oppositely, which is not specifically limited herein. The pixel definition layer 5 can cover the second lead 2142, and can also cover a part of the first lead 2041. The pixel definition layer 5 can be provided with multiple openings 51, and each opening 51 can expose the first electrode layer 411 of one first light emitting device in a one-to-one correspondence.

A structure and specific details of each light emitting unit will be described in detail below through various embodiments.

Figure 11:
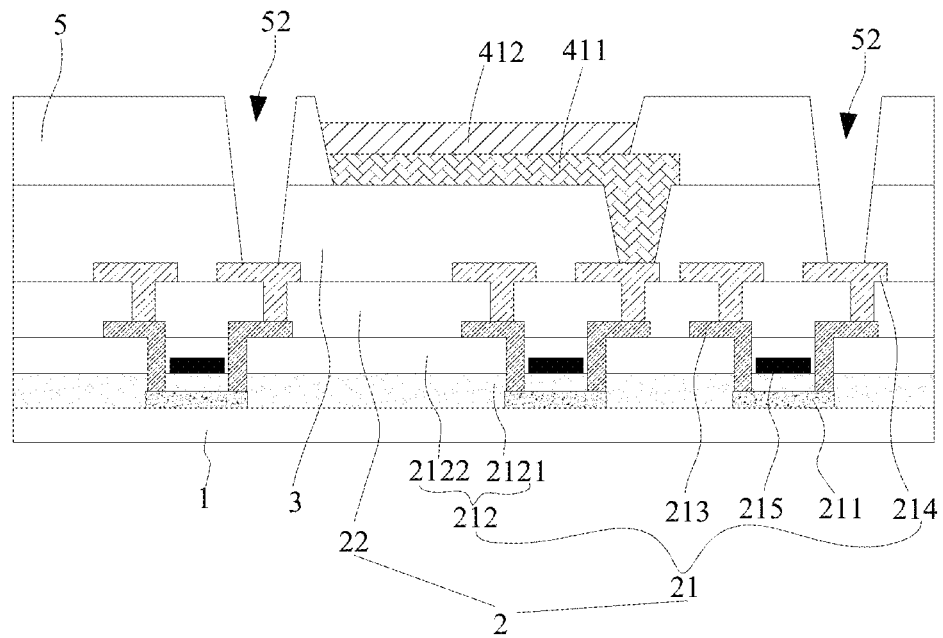
FIG. 11 is a schematic diagram of a light emitting functional layer according to an embodiment of the present disclosure.
Figure 12:
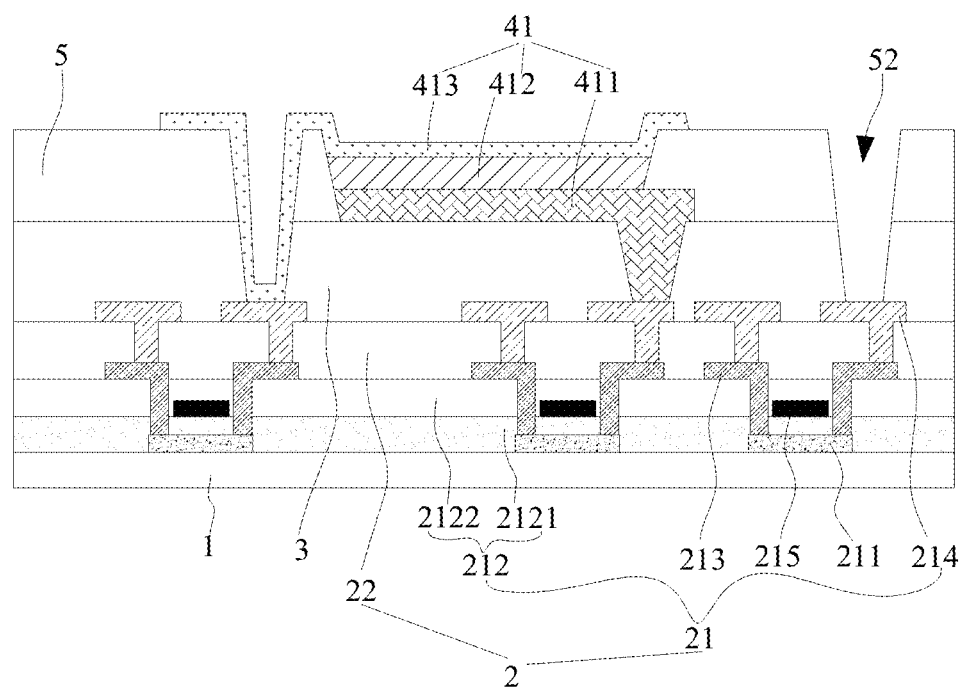
FIG. 12 is a schematic diagram of a second electrode layer according to an embodiment of the present disclosure.

In some embodiments of the present disclosure, as shown in FIG. 11, the light emitting functional layer 412 of the first light emitting device may be formed on a surface of the first electrode layer 411 of the first light emitting device away from the driving backplane 2, and may be at least partially located in the opening 51. As shown in FIG. 12, the second electrode layer 413 of the first light emitting device can be disposed on a surface of the pixel definition layer 5 away from the driving backplane 2, and is coupled to the pixel driving circuit 21 through a via hole 52 penetrating the pixel definition layer 5, so as to power on the second electrode layer 413 of the first light emitting device through the pixel driving circuit 21. An orthographic projection of the second electrode layer 413 of the first light emitting device in the opening 51 at least partially overlaps with an orthographic projection of the light emitting functional layer 412 of the first light emitting device in the opening 51, and the second electrode layer 413 of the first light emitting device is in contact with the light emitting functional layer 412 of the first light emitting device. The light emitting functional layer 412 of the first light emitting device and the second electrode layer 413 of the first light emitting device within a range of the opening 51 and the first electrode layer 411 of the first light emitting device exposed by the opening 51 can jointly constitute the first light emitting device.

Figure 13:
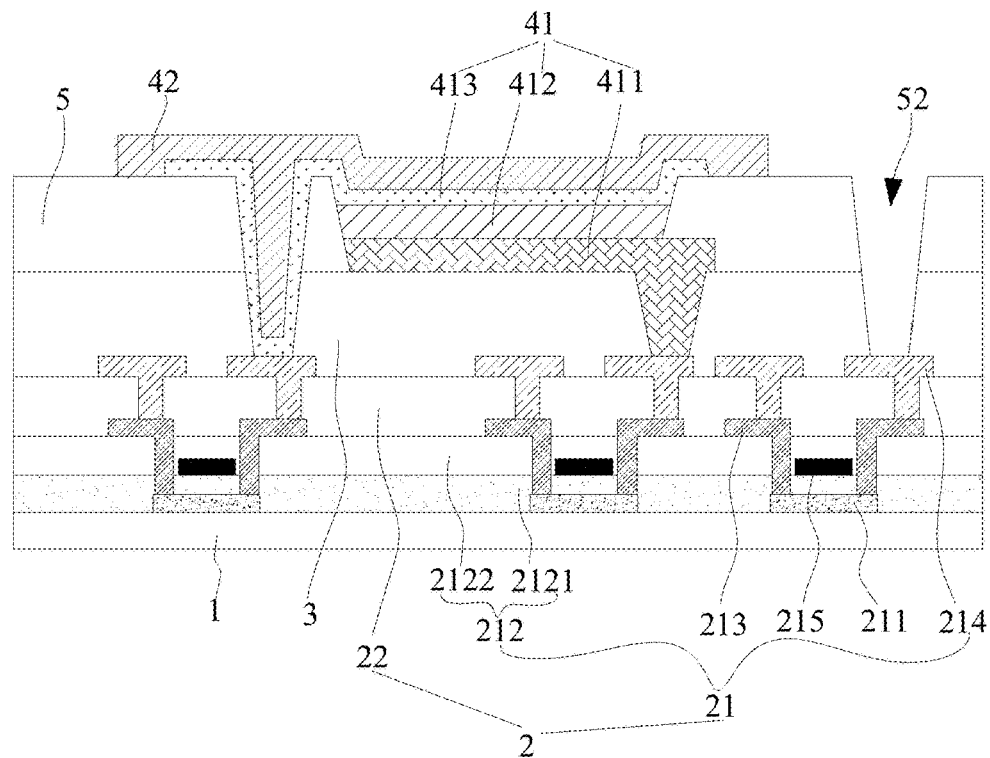
FIG. 13 is a schematic diagram of a light emitting functional layer of a second light emitting device according to an embodiment of the present disclosure.
Figure 14:
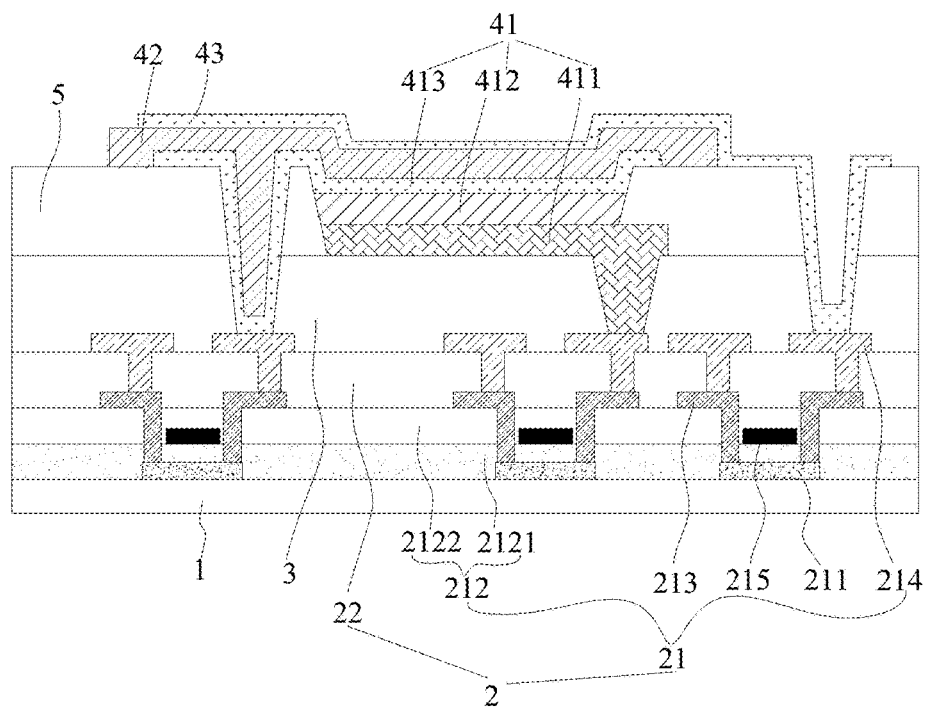
FIG. 14 is a schematic diagram of a second electrode layer of a second light emitting device according to an embodiment of the present disclosure.

The second light emitting device may share an electrode with the first light emitting device. In some embodiments, the first electrode layer of the second light emitting device may be the second electrode layer 413 of the first light emitting device. As shown in FIG. 13, the light emitting functional layer 42 of the second light emitting device covers a surface of the second electrode layer 413 of the first light emitting device away from the driving backplane 2, and its orthographic projection on the driving backplane 2 covers an orthographic projection of the second electrode layer 413 of the first light emitting device on the driving backplane 2. In some embodiments, the light emitting functional layer 42 of the second light emitting device can cover at least a region of the opening 51, and its two ends can extend outward from the region of the opening 51, and two ends of the second electrode layer 413 of the first light emitting device are wrapped with the two ends of the light emitting functional layer 42 of the second light emitting device, respectively, so as to prevent the contact and the short circuit between the second electrode layer 43 of the second light emitting device formed subsequently and the second electrode layer 413 of the first light emitting device. As shown in FIG. 14, the second electrode layer 43 of the second light emitting device can cover surfaces of the light emitting functional layer 42 of the second light emitting device and the pixel definition layer 5, and its orthographic projection in the opening 51 at least partially overlaps with the orthographic projection of the light emitting functional layer 412 of the first light emitting device in the opening 51. In some embodiments, the second electrode layer 43 of the second light emitting device at least extends to the region of the opening 51, and can be coupled to the pixel driving circuit 21 through the via hole 52 penetrating the pixel definition layer 5. The second electrode layer 413 of the first light emitting device, the light emitting functional layer 42 of the second light emitting device and the second electrode layer 43 of the second light emitting device may jointly constitute the second light emitting device.

Figure 15:
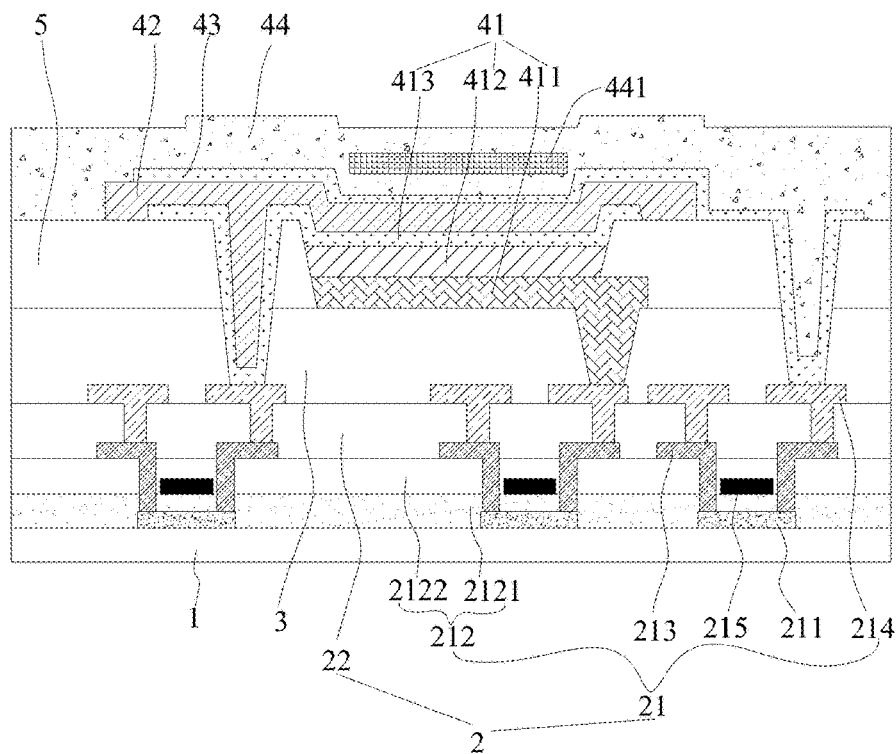
FIG. 15 is a schematic diagram of a light emitting functional layer of a third light emitting device according to an embodiment of the present disclosure.

The third light emitting device can share an electrode with the second light emitting device. In some embodiments, the first electrode layer of the third light emitting device is the second electrode layer 43 of the second light emitting device. As shown in FIG. 15, the light emitting functional layer 44 of the third light emitting device covers a surface of the second electrode layer 43 of the second light emitting device away from the driving backplane 2, and its orthographic projection on the driving backplane 2 covers an orthographic projection of the second electrode layer 43 of the second light emitting device on the driving backplane 2. In some embodiments, the light emitting functional layer 44 of the third light emitting device can cover at least the region of the opening 51, and two ends of the second electrode layer 43 of the second light emitting device can be wrapped with two ends of the light emitting functional layer 44 of the third light emitting device, respectively, so as to prevent the contact and the short circuit between the second electrode layer 45 of the third light emitting device subsequently formed and the second electrode layer 43 of the second light emitting device.

Figure 16:
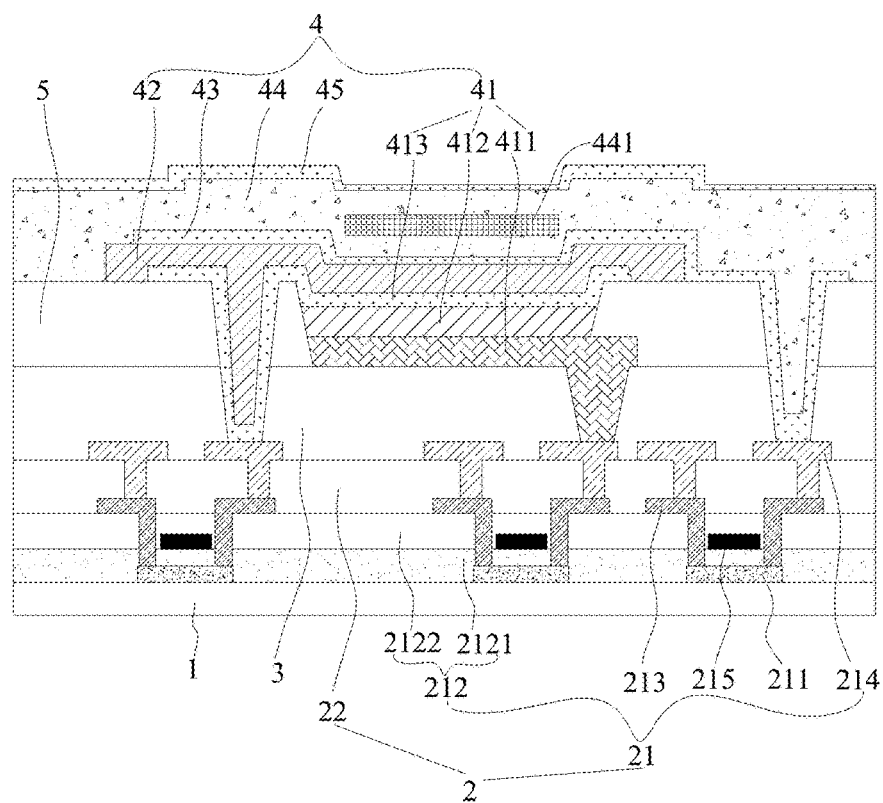
FIG. 16 is a schematic diagram of a second electrode layer of a third light emitting device according to an embodiment of the present disclosure.

As shown in FIG. 16, the second electrode layer 45 of the third light emitting device can cover a surface of the light emitting functional layer 44 of the third light emitting device, and can extend at least to the region of the opening 51, or may also cover the entire surface of the light emitting functional layer 44 of the third light emitting device, which is not specifically limited herein. The second electrode layer 45 of the third light emitting device may be coupled to the peripheral circuit in the edge region B so as to be powered on. The second electrode layer 43 of the second light emitting device, the light emitting functional layer 44 of the third light emitting device and the second electrode layer 45 of the third light emitting device may jointly constitute the third light emitting device.

In an embodiment, the light emitting functional layer 44 of the third light emitting device may include the hole transport layer, a light emitting material layer 441 and the electron transport layer that are sequentially stacked. The hole transport layer may be located on a side of the second electrode layer 43 of the second light emitting device away from the driving backplane 2, and its orthographic projection on the driving backplane 2 covers the orthographic projection of the second electrode layer 43 of the second light emitting device on the driving backplane 2. In some embodiments, the hole transport layer can cover at least the region of the opening 51, and its two ends can extend outward from the region of the opening 51, and the two ends of the second electrode layer 43 of the second light emitting device are wrapped with the two ends of the hole transport layer, respectively. By way of example, the hole transport layer can cover the entire surface of the second electrode layer 43 of the second light emitting device, and also covers surfaces of the light emitting functional layer 42 of the second light emitting device and the pixel definition layer 5 that are not covered by the second electrode layer 43 of the second light emitting device. The light emitting material layer 441 is located on a side of the hole transport layer away from the driving backplane 2, and its orthographic projection in the opening 51 at least partially overlaps with an orthographic projection of the second electrode layer 43 of the second light emitting device in the opening 51. In some embodiments, the light emitting material layer 441 may be disposed at least in the region of the opening 51 so as to emit the light in the region of the opening 51. The electron transport layer can cover a surface of a structure jointly formed by the light emitting material layer 441 and the hole transport layer. In some embodiments, it can at least completely cover the light emitting material layer 441 in the opening 51. In addition, it can also completely cover a structure jointly formed by the light emitting material layer 441 and the hole transport layer of the third light emitting device. The second electrode layer 45 of the third light emitting device may be located on a side of the electron transport layer away from the driving backplane 2, and its orthographic projection in the opening 51 at least partially overlaps with an orthographic projection of the light emitting material layer 441 in the opening 51, to ensure that the light emitting material layer 441 located in the opening 51 normally emits the light.

It should be noted that the light emitting functional layer 44 of the third light emitting device may further include the hole injection layer and the electron injection layer. The hole injection layer may be located between the second electrode layer 43 of the second light emitting device and the hole transport layer, and may be used to improve the hole injection capability of the third light emitting device, thereby increasing the hole mobility. The electron injection layer can be located between the second electrode layer 45 and the electron transport layer of the third light emitting device, and can be used to improve the electron injection capability of the third light emitting device, thereby improving the electron mobility.

In an embodiment, third light emitting devices of individual light emitting units can share the hole transport layer and the electron transport layer. The hole transport layer of the third light emitting devices of the individual light emitting units can be simultaneously formed by a single process, and the electron transport layer of the third light emitting devices of the individual light emitting units can also be simultaneously formed by the single process. In addition, when each third light emitting device includes the electron injection layer and the hole injection layer, the third light emitting devices of the individual light emitting units can share the electron injection layer and the hole injection layer. The electron injection layer of the third light emitting devices of the individual light emitting units can be simultaneously formed by the single process, and the hole injection layer of the third light emitting devices of the individual light emitting units can also be simultaneously formed by the single process, thereby simplifying the process and reducing the manufacturing cost.

In some embodiments of the present disclosure, there may be two pixel driving circuits 21, the two pixel driving circuits 21 may be spaced apart, and may be defined as a first pixel driving circuit and a second pixel driving circuit, respectively. The edge region B can be provided with at least two peripheral circuits, which can be defined as a first peripheral circuit 2021 and a second peripheral circuit 2022, respectively. The first electrode layer 411 of the first light emitting device can be coupled to the first pixel driving circuit, and the second electrode layer 43 of the second light emitting device can be coupled to the second pixel driving circuit. The second electrode layer 413 of the first light emitting device can extend from the pixel region A to the edge region B, and is coupled to the first peripheral circuit 2021 in the edge region B, and the second electrode layer 45 of the third light emitting device can extend from the pixel region A to the edge region B, and is coupled to the second peripheral circuit 2022 in the edge region B, so that the first light emitting device can be controlled to emit the light by the first pixel driving circuit and the first peripheral circuit 2021, the second light emitting device can be controlled to emit the light by the first peripheral circuit 2021 and the second pixel driving circuit, and the third light emitting device can be controlled to emit the light by the second pixel driving circuit and the second peripheral circuit 2022.

Figure 17:
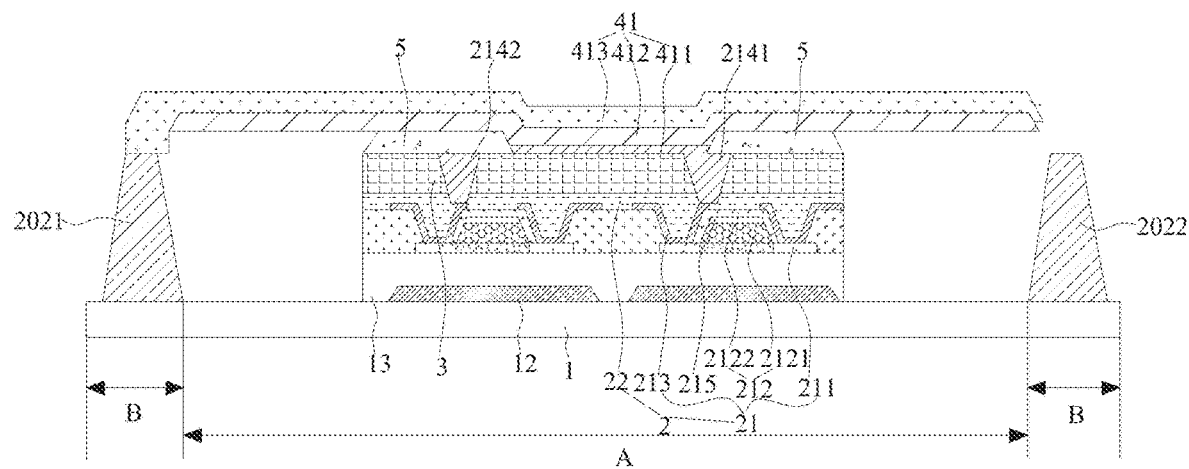
FIG. 17 is a schematic diagram of a light emitting functional layer and a second electrode layer of a first light emitting device according to an embodiment of the present disclosure.

In some embodiments of the present disclosure, as shown in FIG. 17, the light emitting functional layer 412 of the first light emitting device may be formed on the surface of the pixel definition layer 5 away from the driving backplane 2, and an orthographic projection of the first electrode layer 411 of the first light emitting device on the driving backplane 2 is within an orthographic projection of the light emitting functional layer 412 of the first light emitting device on the driving backplane 2, that is, the light emitting functional layer 412 of the first light emitting device can completely cover the first electrode layer 411 of the first light emitting device.

In an embodiment, light emitting functional layers 412 of first light emitting devices of the individual light emitting units can be disposed in the same layer and coupled to each other. For example, the individual light emitting units can share the light emitting functional layer 412 of the first light emitting device, and the light emitting functional layer 412 of the first light emitting devices of the individual light emitting units can be simultaneously formed by the single process, thereby simplifying the process and reducing the manufacturing cost.

The second electrode layer 413 of the first light emitting device can be disposed on a surface of the light emitting functional layer 412 of the first light emitting device away from the driving backplane 2, and the orthographic projection of the light emitting functional layer 412 of the first light emitting device on the driving backplane 2 is within the orthographic projection of the second electrode layer 413 of the first light emitting device on the driving backplane 2, that is, the second electrode layer 413 of the first light emitting device can completely cover the light emitting functional layer 412 of the first light emitting device. In some embodiments, the second electrode layer 413 of the first light emitting device may cover the pixel region A, may also extend from the pixel region A to the edge region B, and may be in contact with and coupled to the first peripheral circuit 2021 in the edge region B.

In an embodiment, second electrode layers 413 of the first light emitting devices of the individual light emitting units can be disposed in the same layer and coupled to each other. For example, the individual light emitting units can share the second electrode layer 413 of the first light emitting device, and the second electrode layer 413 of the first light emitting devices of the individual light emitting units can be simultaneously formed by the single process, thereby further simplifying the process and reducing the manufacturing cost.

The light emitting functional layer 412 of the first light emitting device and the second electrode layer 413 of the first light emitting device within the range of the opening 51 and the first electrode layer 411 of the first light emitting device exposed by the opening 51 may jointly constitute the first light emitting device.

Figure 18:
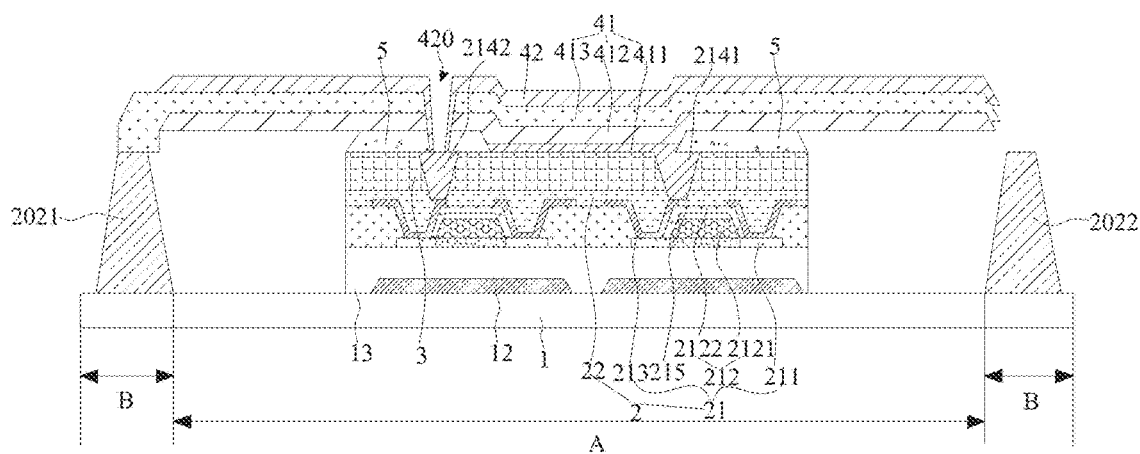
FIG. 18 is a schematic diagram of a light emitting functional layer of a second light emitting device according to an embodiment of the present disclosure.

The second light emitting device may share an electrode with the first light emitting device. In some embodiments, the first electrode layer of the second light emitting device may be the second electrode layer 413 of the first light emitting device. As shown in FIG. 18, the light emitting functional layer 42 of the second light emitting device is disposed on the surface of the second electrode layer 413 of the first light emitting device away from the driving backplane 2, and the light emitting functional layer 42 of the second light emitting device can at least extent to the opening 51, and can be in contact with and coupled to the second electrode layer 413 of the first light emitting device in the opening 51. In some embodiments, the light emitting functional layer 42 of the second light emitting device may at least cover the entire surface of the second electrode layer 413 of the first light emitting device located in the pixel region A, so as to prevent the contact and the short circuit between other film layers formed subsequently and the second electrode layer 413 of the first light emitting device.

In an embodiment, light emitting functional layers 42 of second light emitting devices of the individual light emitting units can be disposed in the same layer and coupled to each other. In some embodiments, the individual light emitting units can share the light emitting functional layer 42 of the second light emitting device, and the light emitting functional layer 42 of the second light emitting devices of the individual light emitting units can be simultaneously formed by the single process, thereby further simplifying the process and reducing the manufacturing cost.

Figure 19:
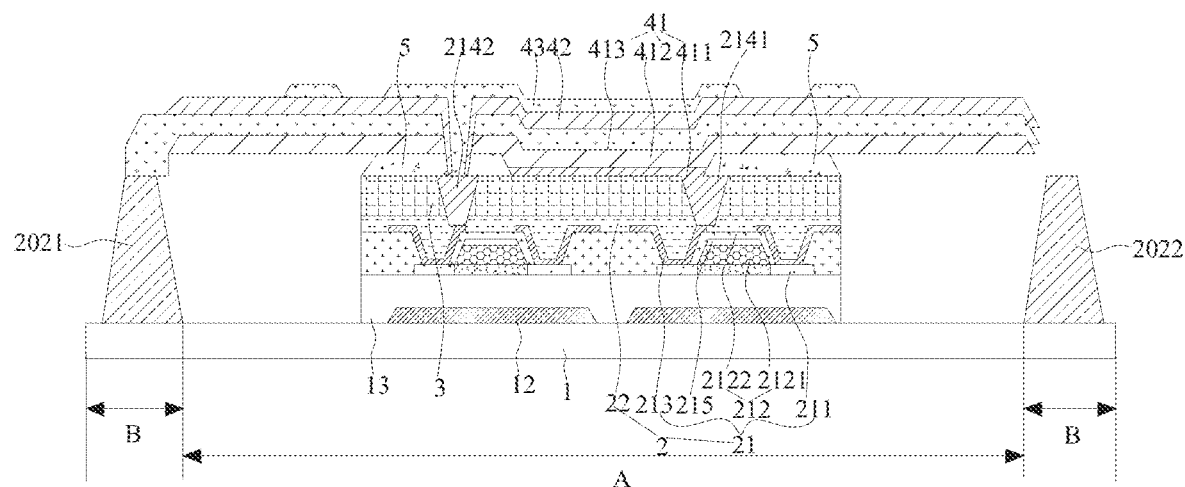
FIG. 19 is a schematic diagram of a second electrode layer of a second light emitting device according to an embodiment of the present disclosure.

As shown in FIG. 19, the second electrode layer 43 of the second light emitting device is disposed on a surface of the light emitting functional layer 42 of the second light emitting device away from the driving backplane 2, and its orthographic projection in the opening 51 at least partially overlaps with an orthographic projection of the light emitting functional layer 42 of the second light emitting device in the opening. The second electrode layer 43 of the second light emitting device can cover the entire region corresponding to the opening 51, and has an extension extending from the region where the opening 51 is located to a periphery of the opening 51. The extension can be coupled to the second pixel circuit through the via hole penetrating the second light emitting functional layer 42 of the second light emitting device, the second electrode layer 413 of the first light emitting device, the light emitting functional layer 412 of the first light emitting device and the pixel definition layer 5, so as to power on the second electrode layer 43 of the second light emitting device through the second pixel driving circuit. The second electrode layer 413 of the first light emitting device, the light emitting functional layer 42 of the second light emitting device, and the second electrode layer 43 of the second light emitting device may jointly constitute the second light emitting device.

The third light emitting device can share an electrode with the second light emitting device. In some embodiments, the first electrode layer of the third light emitting device is the second electrode layer 43 of the second light emitting device, and the light emitting functional layer 44 of the third light emitting device is disposed on the surface of the second electrode layer 43 of the second light emitting device away from the driving backplane 2, the orthographic projection of the second electrode layer 43 of the second light emitting device on the driving backplane 2 is within an orthographic projection of the light emitting functional layer 44 of the third light emitting device on the driving backplane 2. That is, the light emitting functional layer 44 of the third light emitting device can completely cover the surface of the second electrode layer 43 of the second light emitting device away from the driving backplane 2, and the ends of the second electrode layer 43 of the second light emitting device can be wrapped with the light emitting functional layer 44 of the third light emitting device, thereby preventing the contact and the short circuit between other film layers subsequently formed and the second electrode layer 43 of the second light emitting device. Light emitting functional layers 44 of third light emitting devices of the individual light emitting units can be disposed in the same layer and coupled to each other. In some embodiments, the individual light emitting units can share the light emitting functional layer 44 of the third light emitting device, and the light emitting functional layer 44 of the third light emitting devices of the individual light emitting units can be simultaneously formed by the single process, thereby further simplifying the process and reducing the manufacturing cost.

The second electrode layer 45 of the third light emitting device is disposed on a surface of the light emitting functional layer 44 of the third light emitting device away from the driving backplane 2, and its orthographic projection in the opening 51 at least partially overlaps with the orthographic projection of the second electrode layer 43 of the second light emitting device in the opening 51. That is, the second electrode layer 45 of the third light emitting device can extend at least to the region of the opening 51, and can also cover the entire surface of the light emitting functional layer 44 of the third light emitting device, which is not specifically limited herein. The second electrode layer 45 of the third light emitting device may be coupled to the second peripheral circuit 2022 in the edge region B so as to be powered on. The second electrode layer 43 of the second light emitting device, the light emitting functional layer 44 of the third light emitting device, and the second electrode layer 45 of the third light emitting device may jointly constitute the third light emitting device. Second electrode layers 45 of the third light emitting devices of the individual light emitting units can be disposed in the same layer and coupled to each other. In some embodiments, the individual light emitting units can share the second electrode layer 45 of the third light emitting device, and the second electrode layer 45 of the third light emitting devices of the individual light emitting units can be simultaneously formed by the single process, thereby further simplifying the process and reducing the manufacturing cost.

Formation processes for the display panel in the embodiments of the present disclosure will be described in detail below.

Figure 20:
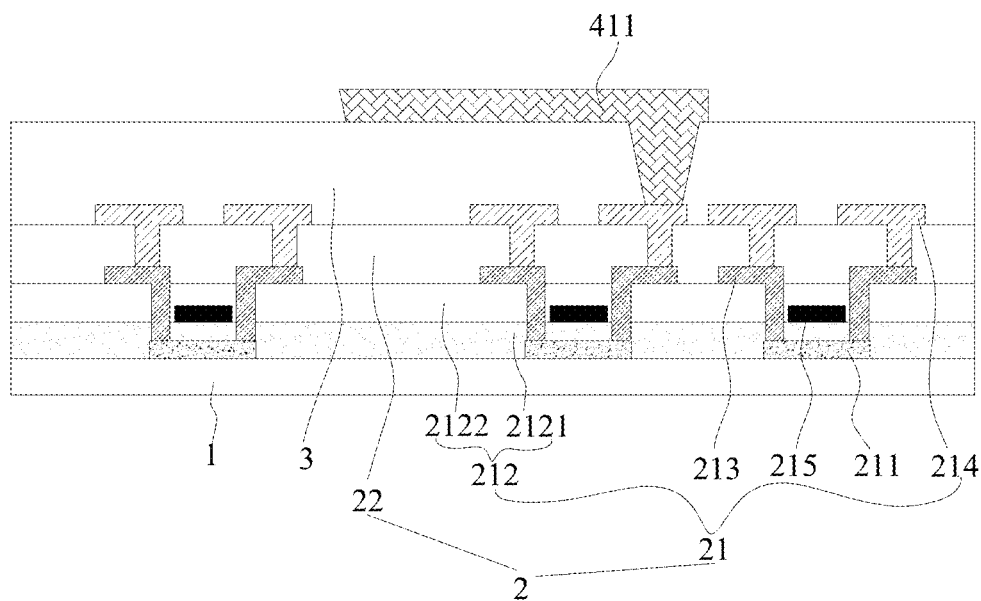
FIG. 20 is a schematic diagram of a first electrode layer of a first light emitting device according to an embodiment of the present disclosure.

In some embodiments of the present disclosure, first electrode layers 411 of multiple first light emitting devices distributed in array can be formed on the surface of the driving backplane 2 by a process such as the chemical vapor deposition, the physical vapor deposition, the vacuum evaporation, the magnetron sputtering, or the atomic layer deposition, as shown in FIG. 20; and the pixel definition layer 5 can be subsequently formed on the surface of the driving backplane 2 and the first electrode layer 411 of each first light emitting device by using the process such as the chemical vapor deposition, the physical vapor deposition or the atomic layer deposition. In addition, the photolithography process is also used to perform photolithography on the pixel definition layer 5 to form the opening 51 exposing the first electrode layer 411 of each first light emitting device, as shown in FIG. 9. A mask with a first mask pattern can be used for masking, the first mask pattern may be the same as a pattern of each opening 51 of the pixel definition layer 5, and then the light emitting functional layer 412 of the first light emitting device may be respectively formed in each opening 51, as shown in FIG. 11.

The photolithography can be performed on the pixel definition layer 5 and the planarization layer 3 to form the via hole 52 penetrating the pixel definition layer 5 and the planarization layer 3, and the via hole 52 can be coupled to one of the pixel driving circuits 21. A mask with a second mask pattern can be used for masking, an opening of the second mask pattern can be larger than an opening of the first mask pattern, and thus, the second electrode layer 413 of the first light emitting device covering the light emitting functional layer 412 of the first light emitting device and part of the pixel definition layer 5 can be formed according to the second mask pattern. In this process, the second electrode layer 413 of the first light emitting device can be coupled to one of the pixel driving circuits 21 through the via hole 52 penetrating the pixel definition layer 5 and the planarization layer 3, as shown in FIG. 12.

A mask with a third mask pattern can be used for masking, and an opening of the third mask pattern can be larger than the opening of the second mask pattern, and then the light emitting functional layer 42 of the second light emitting device can be formed according to the third mask pattern, as shown in FIG. 13.

A mask with a fourth mask pattern can be used for masking, and an opening of the fourth mask pattern can be larger than the opening of the third mask pattern, and then the second electrode layer 43 of the second light emitting device can be formed according to the fourth mask pattern. In this process, the second electrode layer 43 of the second light emitting device can be coupled to one of the pixel driving circuits 21 through the via hole 52 penetrating the pixel definition layer 5 and the planarization layer 3, as shown in FIG. 14.

In order to reduce the manufacturing cost, an open mask can be used for masking, and then the light emitting functional layer 44 of the third light emitting device and the second electrode layer 45 of the third light emitting device are sequentially formed on the surface of the second electrode layer 43 of the second light emitting device, as shown in FIGS. 15 to 16. In this process, a mask with a fifth mask pattern may be used to form the light emitting material layer 441 of the third light emitting device, and the open mask may be used to form other film layers of the light emitting functional layer 44 of the third light emitting device and the second electrode layer 45 of the third light emitting device.

It should be noted that first electrode layers 411 of individual light emitting devices are respectively coupled to different pixel driving circuits 21 in the driving backplane 2 so as to respectively control, by means of a different pixel driving circuit 21, a light emitting device 41 corresponding to the pixel driving circuit 21 to emit the light.

In some embodiments of the present disclosure, in order to reduce the manufacturing cost, the open mask can be used for masking, and then the light emitting functional layer 412 of the first light emitting device and the second electrode layer 413 of the first light emitting device are sequentially formed on a surface of a structure jointly formed by the pixel definition layer 5 and the first electrode layer 411 of the first light emitting device by the process such as the chemical vapor deposition, the physical vapor deposition, the vacuum evaporation, the magnetron sputtering or the atomic layer deposition, as shown in FIG. 17.

Figure 21:
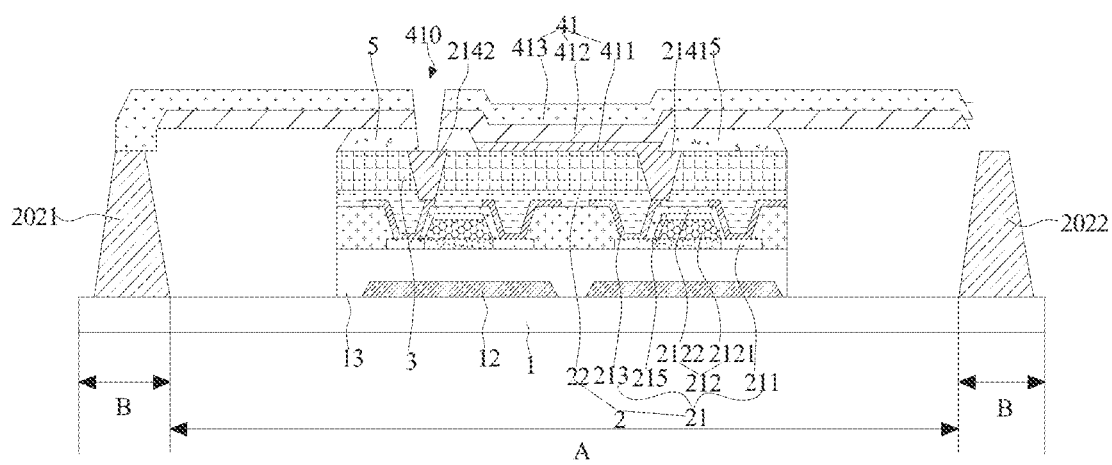
FIG. 21 is a schematic diagram of a first contact hole according to an embodiment of the present disclosure.

A laser drilling technology can be used to perform a drilling operation on a region in the light emitting functional layer 412 of the first light emitting device, the second electrode layer 413 of the first light emitting device and the pixel definition layer 5 corresponding to the second lead 2142, until the second lead 2142 is exposed, and then a first contact hole 410 is formed, as shown in FIG. 21. An aperture of the first contact hole 410 should not be too large or too small. A size of the aperture of the first contact hole 410 can be controlled to reduce a resistance of the second lead 2142 while reducing spacings between individual light emitting units. In some embodiments, the aperture of the first contact hole 410 may be 1 um-10 um.

Figure 22:
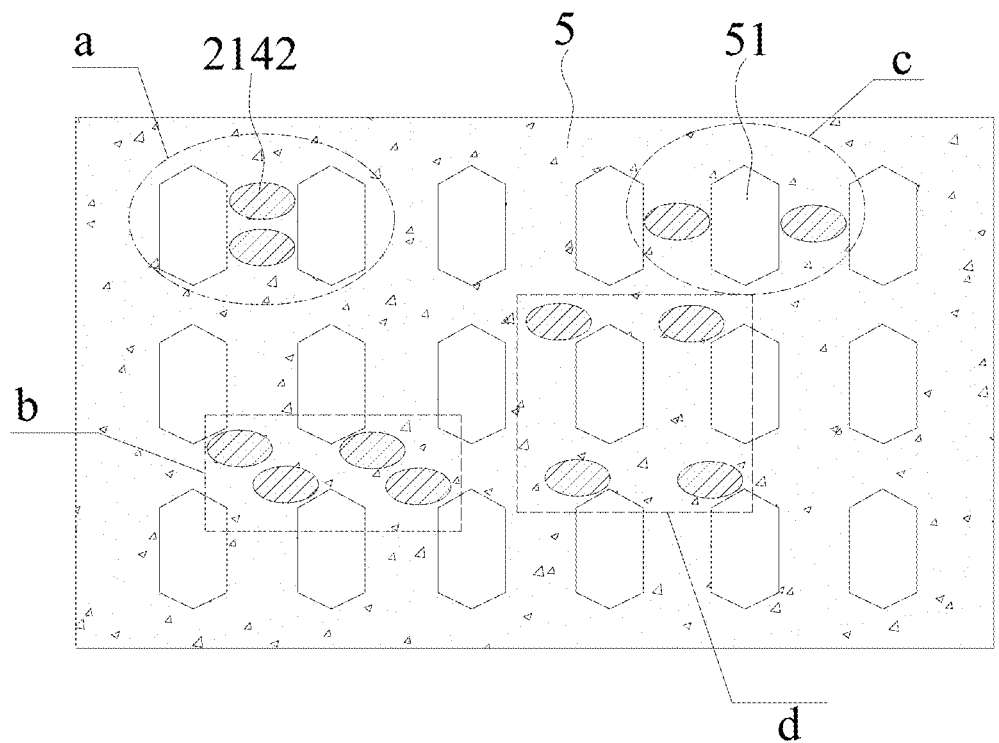
FIG. 22 is a schematic diagram of distribution of second leads according to an embodiment of the present disclosure.

Multiple first contact holes 410 can be simultaneously formed through the same laser drilling process, and each first contact hole 410 can expose the second lead 2142 of each light emitting unit in a one-to-one correspondence. As shown in FIG. 22, second leads 2142 in adjacent light emitting units can be arranged adjacently as an arrangement shown in region a and region b in the figure. In addition, the second leads 2142 in the adjacent light emitting units can be arranged oppositely as an arrangement shown in region c and region d in the figure. Please note that the second leads 2142 in the adjacent light emitting units can also be arranged in other manners, as long as they are spaced apart from the first electrode layer 411 of the first light emitting device and the first lead 2141 to avoid the occurrence of short circuit.

Figure 23:
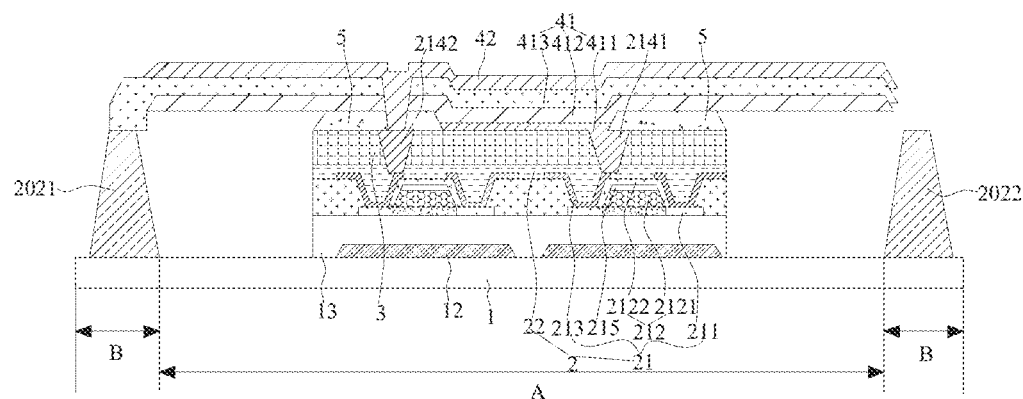
FIG. 23 is a schematic diagram of a light emitting functional layer of a second light emitting device before being punched according to an embodiment of the present disclosure.

As shown in FIG. 23, the open mask can be used for masking, and then the light emitting functional layer 42 of the second light emitting device is deposited on the surface of the second electrode layer 413 of the first light emitting device by means of the magnetron sputtering. In the sputtering process, the light emitting functional layer 42 can cover the first contact hole 410, and thus, sidewalls of the first contact hole 410 can be isolated from other film layers subsequently formed by means of the light emitting functional layer 42 of the second light emitting device to prevent the short circuit.

The laser drilling process may be used to perform the drilling operation on the light emitting functional layer 42 of the second light emitting device covering the inside of the first contact hole 410 to form a second contact hole 420, as shown in FIG. 18, and the second contact hole 420 may expose the second lead 2142. The second contact hole 420 may be sleeved in the first contact hole 410, and the light emitting functional layer 42 of the second light emitting device can be filled between a hole wall of the second contact hole 420 and a hole wall of the first contact hole 410. In some embodiments, an aperture of the second contact hole 420 may be smaller than the aperture of the first contact hole 410, for example, the aperture of the second contact hole 420 may be 0.2 um-5 um.

The second electrode layer 43 of the second light emitting device can be formed on the surface of the light emitting functional layer 42 of the second light emitting device away from the driving backplane 2. As shown in FIG. 19, the orthographic projection of the second electrode layer 43 of the second light emitting device in the opening 51 at least partially overlaps with the orthographic projection of the light emitting functional layer 42 of the second light emitting device in the opening 51, and the second contact hole 420 is filled with the second electrode layer 43 of the second light emitting device, so that the second electrode layer 43 of the second light emitting device is coupled to the pixel driving circuit 21 through the second contact hole 420.

The second electrode layer 43 of the second light emitting device can completely cover the region corresponding to the opening 51 and can extend from the region corresponding to the opening 51 to the periphery of the opening 51, and it can extend at least to a region corresponding to the second contact hole 420. In an embodiment, the fine mask can be used for masking, and the fine mask has an opening exposing the region where the opening 51 is located and the second contact hole 420, so that the transparent conductive material can be deposited at the opening of the fine mask by an evaporation process to form the second electrode layer 43 of the second light emitting device. In another embodiment, the open mask can be used to form the transparent conductive material on the surface of the light emitting functional layer 42 of the second light emitting device away from the driving backplane 2, and then the transparent conductive material is subsequently patterned by a laser cutting process to remove the transparent conductive materials covering regions other than the region where the opening 51 is located and the second contact hole 420. It should be noted that the transparent conductive materials between the region where the opening 51 is located and the second contact hole 420 are continuous and uninterrupted.

Figure 24:
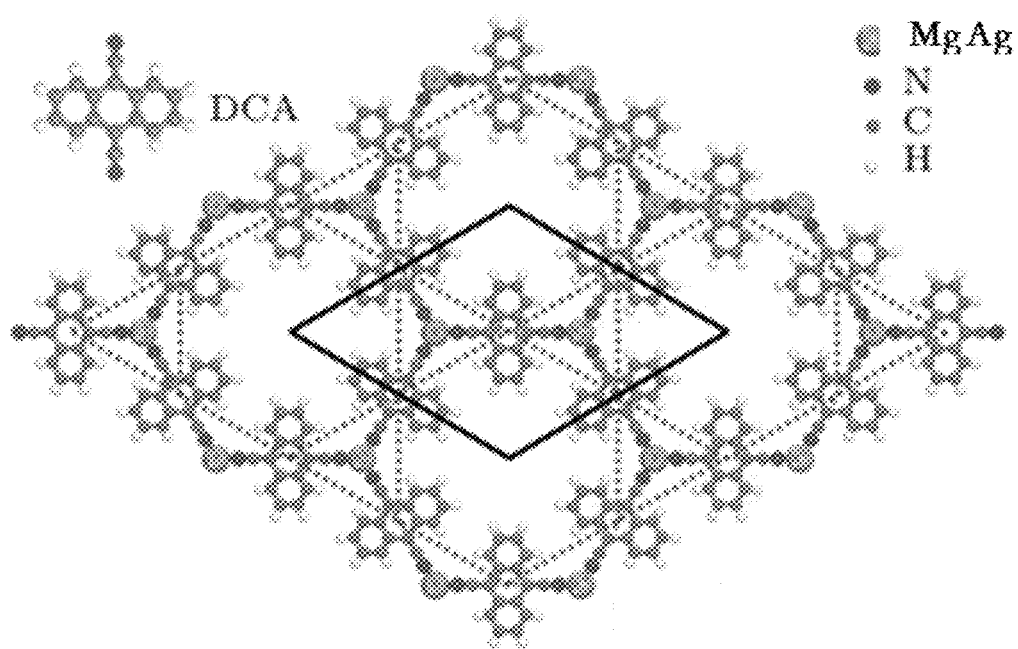
FIG. 24 is a schematic diagram of an atomic structure of an organic crystal lattice according to an embodiment of the present disclosure.

In an embodiment, after the light emitting functional layer 42 of the second light emitting device is formed, it may not be subjected to the drilling operation, but an organic topological insulating film layer is formed on its surface. The organic topological insulating film layer is composed of an organic metal topological insulator MgAg-DCA (dicyanoanthracene), and an atomic structure of its material's organic lattice is shown in FIG. 24, where an upper left inset is a schematic diagram of a DCA molecular structure.

The organic topological insulating film layer can be formed by a thermal evaporation process, and can cover regions other than the region corresponding to the opening 51. The drilling operation is performed on a region in the organic topological insulating layer, the light emitting functional layer 42 of the second light emitting device, the second electrode layer 413 of the first light emitting device, the light emitting functional layer 412 of the first light emitting device and the pixel definition layer 5 corresponding to the second lead 2142 to form the second contact hole 420, and the second contact hole 420 can expose the second lead 2142. Subsequently, a metal electrode can be deposited in a region which is not covered by an organic topological insulating material to form the second electrode layer 43 of the second light emitting device. In this process, since there is a principle of non-film formation between the metal electrode and the organic topological insulating material, the second electrode layer 43 of the second light emitting device may not be formed on the organic topological insulating layer during the process of forming the second electrode layer 43 of the second light emitting device, and accordingly, the second electrode layer 43 of the second light emitting device is automatically patterned during the formation process. In addition, the second contact hole 420 can be filled with the metal electrode during the deposition process, and then the metal electrode can be coupled to the second pixel driving circuit through the second contact hole 420.

In order to reduce the manufacturing cost, the open mask can be used for masking, and then the light emitting functional layer 44 of the third light emitting device and the second electrode layer 45 of the third light emitting device are sequentially formed on the surface of the second electrode layer 43 of the second light emitting device. As shown in FIG. 3, the second electrode layer 45 of the third light emitting device can extend from the pixel region A to the edge region B, and is coupled to the second peripheral circuit 2022 in the edge region B so as to drive the third light emitting device to emit light through the second pixel driving circuit and the second peripheral circuit 2022.

In some embodiments of the present disclosure, the display panel may further include a second light shielding layer 6. As shown in FIG. 2, the second light shielding layer 6 may be disposed on a side of the light emitting device layer 4 away from the driving backplane 2, and has multiple light transmitting holes 61 distributed in an array. Each light transmitting hole 61 can be the via hole, and its shape can be a rectangle, a circle, an ellipse, or other shapes, which will not be listed here. The light transmitting holes 61 can be disposed in a one-to-one correspondence with individual openings in the pixel definition layer 5, and each light transmitting hole 61 at least partially overlaps with each opening in the pixel definition layer 5, and the overlapping region may be a region where all film layers in each light emitting unit overlap. The light emitted from the light emitting unit can exit from the light transmitting hole 61, and a light emitting area of each light emitting unit can be defined by the light transmitting hole 61.

In an embodiment, a material of the second light shielding layer 6 can be a metal or an organic material, which is not specifically limited herein. A light shielding film layer can be formed on the side of the light emitting device layer 4 away from the driving backplane 2 by using the vacuum evaporation, the magnetron sputtering, the chemical vapor deposition or the physical vapor deposition, and the photolithography process is used to form the light transmitting hole 61 in the light shielding film layer and then the second light shielding layer 6 is formed. In some embodiments, the light shielding film layer can be deposited on the side of the light emitting device layer 4 away from the driving backplane 2, and the photoresist can be formed on a side of the light shielding film layer away from the driving backplane 2. The mask is used to expose and develop the photoresist to form a developing region, and a pattern of the developing region can be the same as a pattern required by the second light shielding layer 6, and its size can be equal to a size of the light transmitting hole 61. The light shielding film layer can be anisotropically etched in the developing region to form the second light shielding layer 6, and finally the remaining photoresist on a surface of the second light shielding layer 6 can be stripped to expose the second light shielding layer 6 formed by photolithography.

In some embodiments of the present disclosure, the display panel may further include an encapsulation layer 7. As shown in FIG. 25, the encapsulation layer 7 may be located on the side of the light emitting device layer 4 away from the driving backplane 2, and may be used to block external water and oxygen and avoid the light emitting device layer 4 being corroded by the external water and oxygen, which can prolong the service life of the device. In some embodiments, the encapsulation layer 7 may be located between the light emitting device layer 4 and the second light shielding layer 6, or may be located on a side of the second light shielding layer 6 away from the light emitting device layer 4, which is not specifically limited herein.

The encapsulation layer 7 can be made of organic materials or inorganic materials, and can also be a composite film layer with alternating organic layers and inorganic layers. In some embodiments, a material of the encapsulation layer 7 can be an acrylic material, or a composite film layer composed of materials such as silicon nitride, silicon oxide or silicon oxynitride, which is not specifically limited here.

In an embodiment, the encapsulation layer 7 may be a composite film layer structure with alternating organic layers and inorganic layers. In some embodiments, the encapsulation layer 7 may include a first inorganic layer, an organic layer, and a second inorganic layer, the first inorganic layer may be formed on a surface of the light emitting device layer 4, the second inorganic layer is formed on a side of the first inorganic layer away from the light emitting device layer 4, and the organic layer is located between the first inorganic layer and the second inorganic layer. Water and oxygen can be blocked through the inorganic layers, and a stress of the inorganic layers can be released through the organic layer to prevent the peeling between the light emitting device layer 4 and the first inorganic layer due to the stress.

The embodiments of the present disclosure also provide a manufacturing method for a display panel. The display panel may be the display panel of any of the above-mentioned embodiments, and the structure of the display panel will not be described in detail here. As shown in FIG. 26, the manufacturing method may include step S110 to step S120.

In the step S110, the driving backplane 2 including the multiple pixel driving circuits 21 is formed; and in the step S120, the light emitting device layer is formed on a side of the driving backplane; the light emitting device layer includes the multiple light emitting units distributed in an array, and the light emitting unit includes the multiple light emitting devices stacked in the direction away from the driving backplane; light emitting devices other than the light emitting device closest to the driving backplane in the direction perpendicular to the driving backplane are transparent devices; and in the same light emitting unit, at least part of the light emitting devices are coupled to the pixel driving circuits for emitting light under driving of the pixel driving circuits, and at least two light emitting devices in the same light emitting unit have different light emitting materials.

Figure 27:
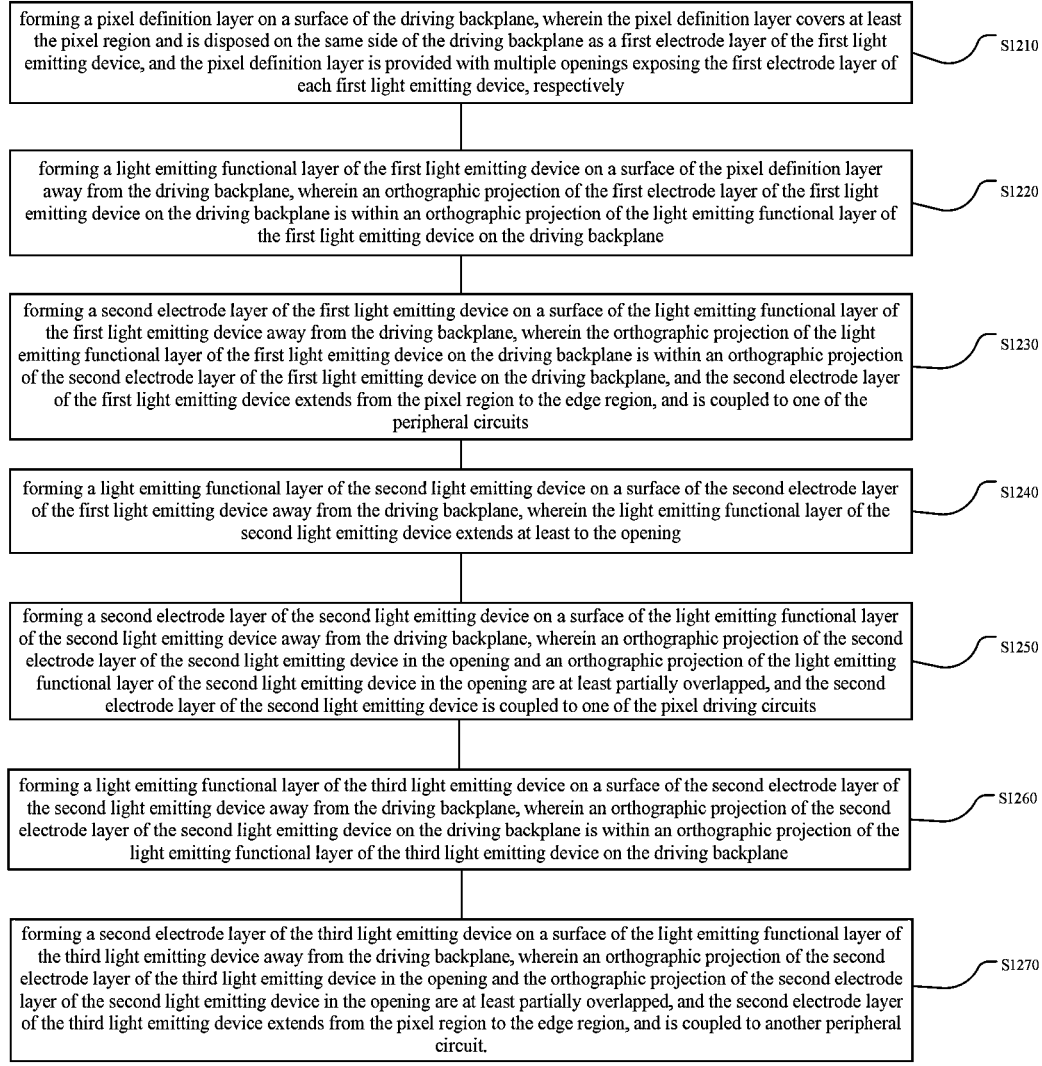
FIG. 27 is a flowchart of step S120 according to an embodiment of the present disclosure.

In an embodiment of the present disclosure, as shown in FIG. 27, the forming the light emitting device layer on the side of the driving backplane, that is, the step S120, includes:

in step S1210, the pixel definition layer is formed on the surface of the driving backplane; the pixel definition layer covers at least the pixel region and is disposed on the same side of the driving backplane as the first electrode layer of the first light emitting device, and the pixel definition layer is provided with the multiple openings exposing the first electrode layer of each first light emitting device, respectively;

in step S1220, the light emitting functional layer of the first light emitting device is formed on a surface of the pixel definition layer away from the driving backplane; an orthographic projection of the first electrode layer of the first light emitting device on the driving backplane is within an orthographic projection of the light emitting functional layer of the first light emitting device on the driving backplane;

in step S1230, the second electrode layer of the first light emitting device is formed on a surface of the light emitting functional layer of the first light emitting device away from the driving backplane; the orthographic projection of the light emitting functional layer of the first light emitting device on the driving backplane is within an orthographic projection of the second electrode layer of the first light emitting device on the driving backplane, and the second electrode layer of the first light emitting device extends from the pixel region to the edge region, and is coupled to one of the peripheral circuits;

in step S1240, the light emitting functional layer of the second light emitting device is formed on a surface of the second electrode layer of the first light emitting device away from the driving backplane, and the light emitting functional layer of the second light emitting device extends at least to the opening;

in step S1250, the second electrode layer of the second light emitting device is formed on a surface of the light emitting functional layer of the second light emitting device away from the driving backplane; an orthographic projection of the second electrode layer of the second light emitting device in the opening at least partially overlaps with an orthographic projection of the light emitting functional layer of the second light emitting device in the opening, and the second electrode layer of the second light emitting device is coupled to one of the pixel driving circuits;

in step S1260, the light emitting functional layer of the third light emitting device is formed on a surface of the second electrode layer of the second light emitting device away from the driving backplane; an orthographic projection of the second electrode layer of the second light emitting device on the driving backplane is within an orthographic projection of the light emitting functional layer of the third light emitting device on the driving backplane; and in step S1270, the second electrode layer of the third light emitting device is formed on a surface of the light emitting functional layer of the third light emitting device away from the driving backplane; an orthographic projection of the second electrode layer of the third light emitting device in the opening at least partially overlaps with an orthographic projection of the second electrode layer of the second light emitting device in the opening, and the second electrode layer of the third light emitting device extends from the pixel region to the edge region, and is coupled to another peripheral circuit.

The specific details and beneficial effects of the manufacturing method of the embodiments of the present disclosure have been described in the above embodiments of the display panel, and thus, the details are not repeated here.

It should be noted that although various steps of the manufacturing method for the display panel of the present disclosure are described in a particular order in the figures, this is not required or implied that these steps must be performed in this particular order, or all the steps shown must be performed to achieve the desired result. Additionally or alternatively, certain steps may be omitted, multiple steps may be combined into one step, and/or one step may be decomposed into multiple steps and so on.

The embodiments of the present disclosure also provide a display device, and the display device may include the display panel of any of the above-mentioned embodiments, and its structure and beneficial effects can refer to the above-mentioned embodiments of the display panel, which will not be described in detail here. The display device of the embodiments of the present disclosure may be a device for displaying an image, such as a mobile phone, a display screen, a tablet computer, a TV, a micro display device, etc., which will not be listed here.

Figure 28:
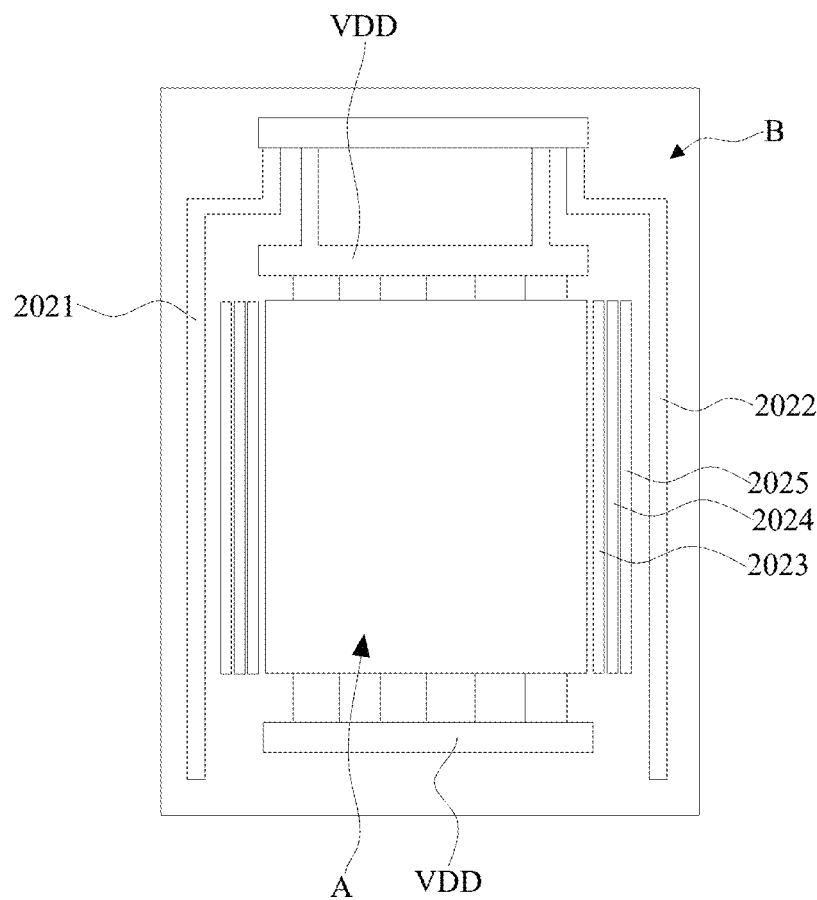
FIG. 28 is a top view of a display panel according to an embodiment of the present disclosure.

The present disclosure also provides a pixel driving circuit, applied to the display panel in any of the above embodiments. As shown in FIG. 28, the display panel may be an AMOLED display panel, and the display panel may include the driving backplane and multiple light emitting units distributed on a side of the driving backplane in an array, each light emitting unit may include multiple light emitting devices connected in series between a first power terminal VDD and a second power terminal VSS to emit light. The display panel can be divided into a pixel region A and an edge region B located outside the pixel region.

The driving backplane may include a substrate and a driving circuit disposed on the substrate. The driving circuit may include a pixel driving circuit located in the pixel region A and a peripheral circuit located in the edge region B. The peripheral circuit may include a light emitting control circuit 2023, a gate driving circuit 2024, a source driving circuit 2025 and so on. The light emitting control circuit 2023 can be used to output a light emitting control signal to the pixel driving circuit, the gate driving circuit 2024 can be used to output a writing control signal to the pixel driving circuit, and the source driving circuit 2025 can be used to output a data signal to the pixel driving circuit. In addition, the driving circuit can also be used to output a first power signal to the first power terminal VDD of the pixel driving circuit, and to output a second power signal to the second power terminal VSS.

Each light emitting device may be an OLED light emitting element, that is, an organic light emitting diode, which may have a first terminal and a second terminal. The first terminal may be an anode, and the second terminal may be a cathode. The first terminal of the light emitting device can be coupled to the pixel driving circuit, and the second terminal is used to input the second power signal.

The light emitting control signal, the writing control signal, the data signal, the first power signal and the second power signal are inputted to the pixel driving circuit and the light emitting device by controlling the peripheral circuit to make the light emitting device emit light to display the image.

Figure 29:
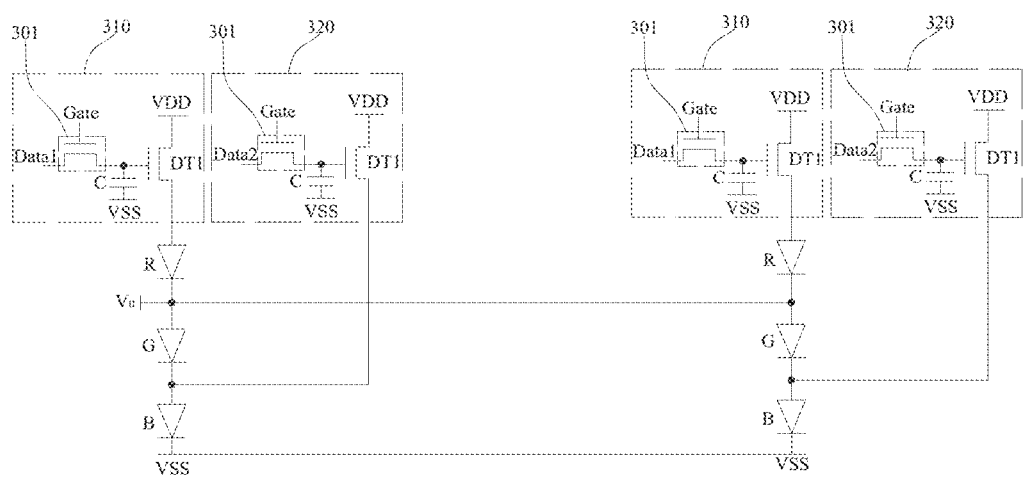
FIG. 29 is a schematic diagram of a pixel driving circuit according to an embodiment of the present disclosure.

As shown in FIG. 29, in some embodiments of the present disclosure, the pixel driving circuit includes a driving unit, and the driving unit may include a driving transistor, a data writing unit 301, and an energy storage unit C.

The driving transistor has a control terminal, a first terminal and a second terminal, and the second terminal of the driving transistor is configured to be coupled to the first terminal of the light emitting device.

The data writing unit 301 is configured to be turned on in response to the writing control signal to transmit the data signal to the first terminal of the driving transistor.

A first terminal of the energy storage unit C is coupled to the first power terminal VDD, and a second terminal of the energy storage unit C is coupled to the control terminal of the driving transistor.

A signal input terminal is coupled between two adjacent light emitting devices.

There may be three light emitting devices, which are respectively the first light emitting device, the second light emitting device, and the third light emitting device. In the embodiments of the present disclosure, the light emitted by the first light emitting device may be red (R), the light emitted by the second light emitting device may be green (G), and the light emitted by the third light emitting device may be blue (B).

The second terminal of the driving transistor is coupled to the first light emitting device (R);
  the second light emitting device (G) is coupled between the first light emitting device (R) and the third light emitting device (B);
  a second terminal of the third light emitting device (B) is coupled to the second power terminal VSS; and
  a signal input terminal coupled between the first light emitting device (R) and the second light emitting device (G) is a first signal input terminal, and a signal input terminal coupled between the second light emitting device (G) and the third light emitting device (B) is a second signal input terminal. It should be noted that second terminals of first light emitting devices of two adjacent light emitting units are coupled to the same first signal input terminal, so that the first light emitting devices (R) or the second light emitting devices (G) of multiple light emitting units can be simultaneously controlled through the same signal input terminal to emit light.

The signal input terminal can be the driving unit or other types of signal input ports, which is not specifically limited herein. In an embodiment, at least one of the first signal input terminal and the second signal input terminal is the driving unit, for example, the second signal input terminal is the driving unit. For easy distinction, a driving transistor of a driving unit coupled to the first light emitting device (R) can be defined as a first driving transistor DT1, and a driving transistor of a driving unit as the second signal input terminal can be defined as a second driving transistor DT2.

Figure 30:
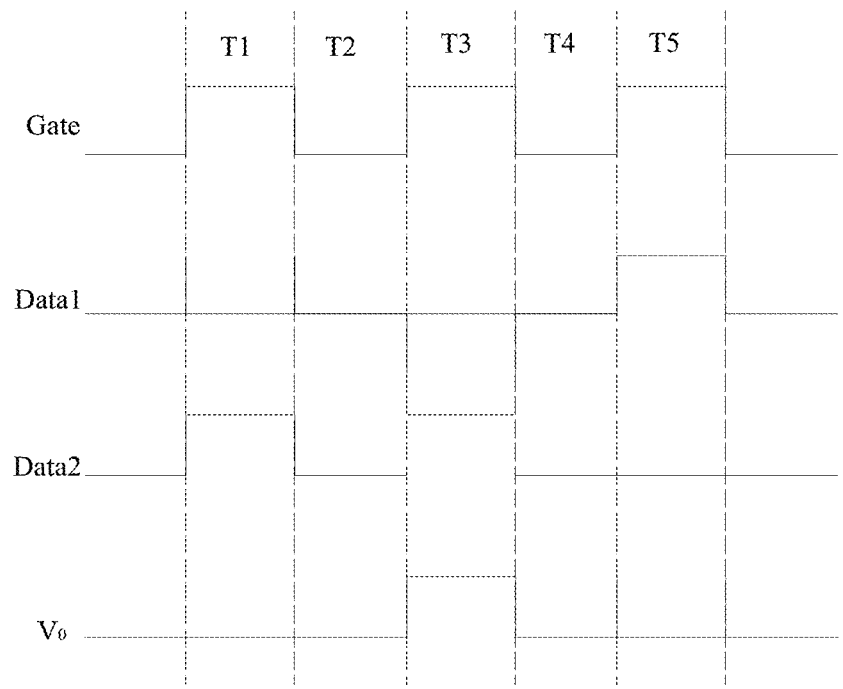
FIG. 30 is a timing diagram of an operating principle of a pixel driving circuit according to an embodiment of the present disclosure.

As shown in FIGS. 29 and 30, an operating process of the pixel driving circuit of the embodiments of the present disclosure is as follows:
  in a data writing stage, the data writing unit 301 of each driving unit is turned on to transmit the data signal to the control terminal of the driving transistor through the data writing unit 301 and the driving transistor, and to charge the energy storage unit C; and
  in a light emitting stage, the energy storage unit C inputs an electrical signal to the driving transistor to turn on the driving transistor, the first power signal is inputted to the first terminal of the first light emitting device (R)

through the first power terminal VDD, and a first signal is inputted through the first signal input terminal V0 to control the first light emitting device (R) to emit light; a second signal is inputted to the second signal input terminal and a third signal is inputted to the first signal input terminal V0 to control the second light emitting device (G) to emit light; and a fourth signal is inputted to the second signal input terminal, and the second power signal is inputted to the second power terminal VSS to control the third light emitting device (B) to emit light.

In the above process, as shown in FIG. 30, when a first power signal Data is a positive voltage, the first light emitting device (R) and the third light emitting device (B) are controlled to display, and when the first power signal Data is a negative voltage, the second light emitting device (B) is controlled to display. Specifically, T1 to T5 are continuous stages, in the T1 stage, a data signal Gate is at a high level, the first power signal Data1 input to the first driving transistor DT1 is the negative voltage, the first power signal Data2 input to the second driving transistor DT2 is the positive voltage, the fourth signal input to the first signal input terminal V0 is at a low level, and the first power signal Data2 input to the second driving transistor DT2 is transmitted to the first terminal of the third light emitting device (B), forming a voltage difference with the second power signal inputted to the second terminal of the third light emitting device (B) to make the third light emitting device (B) emit light; at this time, a voltage V(B) across the third light emitting device (B)=Data2−the second power signal; in the T2 stage, the data signal Gate, the first power signal Data1 input to the first driving transistor, the first power signal Data2 input to the second driving transistor, and the first signal input to the first signal input terminal V0 are all at the low level, all light emitting devices do not emit light; in the T3 stage, the data signal Gate is at the high level, the first power signal Data1 input to the first driving transistor DT1 is the negative voltage, the first power signal Data2 input to the second driving transistor is the positive voltage, the third signal input to the first signal input terminal V0 is at the high level, and the third signal input to the first signal input terminal V0 and the first power signal Data2 input to the second driving transistor form the voltage difference across the second light emitting device (G) to make the second light emitting device (G) emit light, and at this time, a voltage V(G) across the second light emitting device (G)=V0−Data2; in the T4 stage, the data signal Gate, the first power signal Data1 input to the first driving transistor, the first power signal Data2 input to the second driving transistor, and the first signal input to the first signal input terminal V0 are all at the low level, and all light emitting devices do not emit light; and in the T5 stage, the data signal Gate is at the high level, the first power signal Data1 input to the first driving transistor DT1 is the positive voltage, the first power signal Data2 input to the second driving transistor DT2 is the negative voltage, the first signal input to the first signal input terminal V0 is at the low level, and the first power signal Data1 input to the first driving transistor DT1 and the first signal input to the first signal input terminal V0 form the voltage difference to make the first light emitting device (R) emit light. Therefore, in the T1 stage, B displays, in the T3 stage, G displays, and in the T5 stage, R displays, thereby realizing the RGB time-sharing display.

Figure 31:
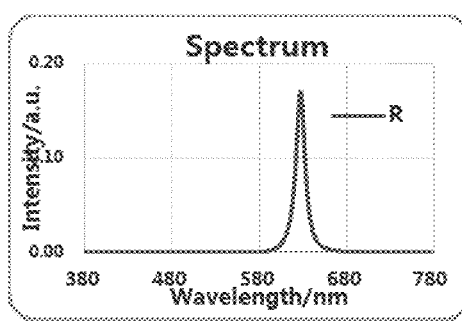
FIG. 31 is a spectrum of a first light emitting device (R) according to an embodiment of the present disclosure.
Figure 32:
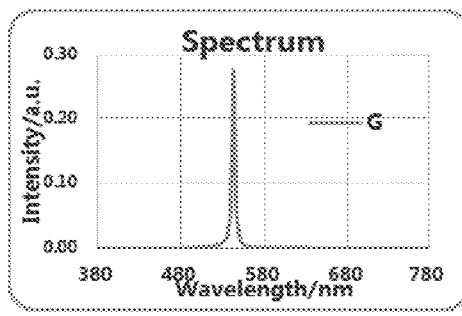
FIG. 32 is a spectrum of a first light emitting device (G) according to an embodiment of the present disclosure.

When the three light emitting devices of RGB emit light in a time-sharing manner, a spectrum of the first light emitting device (R) is shown in FIG. 31, a spectrum of the second light emitting device (G) is shown in FIG. 32, and a spectrum of the third light emitting device (B) is shown in FIG. 33. In FIGS. 31 to 33, the abscissa is wavelength, and the ordinate is the intensity. After calculation, when the three light emitting devices of RGB emit light in the time-sharing manner, the color gamut is greater than NTSC 117%.

In addition, multiple light emitting devices can also be controlled to emit light at the same time, that is: when the three light emitting devices of RGB emit light at the same time, a voltage value across each light emitting device can be adjusted to obtain a spectrum of any color. The obtained spectrum is shown in FIG. 34, where the abscissa is the wavelength and the ordinate is the intensity.

The present disclosure also provides a driving method for a pixel driving circuit. The pixel driving circuit is the pixel driving circuit of any of the above-mentioned embodiments, and its structure is not described in detail here.

For the pixel driving circuit in the embodiments of the present disclosure, the driving method of the present disclosure may include step S210 to step S220, as shown in FIG. 35, in which:
  in the step S210, in the data writing stage, the data writing unit is turned on to transmit the data signal to the control terminal of the driving transistor through the data writing unit and the driving transistor, and to charge the energy storage unit; and
  in the step S220, in the light emitting stage, the energy storage unit inputs an electrical signal to the driving transistor to turn on the driving transistor, a first power signal is inputted to the first terminal of the first light emitting device through the first power terminal, a first signal is inputted through the first signal input terminal to control the first light emitting device to emit light; a second signal is inputted to the second signal input terminal and a third signal is inputted to the first signal input terminal to control the second light emitting device to emit light; and a fourth signal is inputted to the second signal input terminal and a second power signal is inputted to the second power input terminal to control the third light emitting device to emit light.

The details and beneficial effects of the above-mentioned driving method have been described in the above embodiments of the pixel driving circuit. For details, reference may be made to the structure and operating process of the pixel driving circuit, which will not be repeated here.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A display panel, comprising:
  a driving backplane, comprising multiple pixel driving circuits; and
  a light emitting device layer, comprising multiple light emitting units distributed in an array, wherein each light emitting unit comprises multiple light emitting devices stacked in a direction away from the driving backplane, and light emitting devices other than a light emitting device closest to the driving backplane in a direction perpendicular to the driving backplane are transparent devices; and wherein in the same light emitting unit, at least part of the light emitting devices are coupled to the pixel driving circuits for emitting light under driving of the pixel driving circuits, and at least two light emitting devices in the same light emitting unit have different light emitting materials, wherein the number of light emitting devices in the same light emitting unit is three, comprising a first light emitting device, a second light emitting device and a third light emitting device distributed in the direction away from the driving backplane;

wherein the driving backplane comprises a pixel region and an edge region located outside the pixel region, each pixel driving circuit is located in the pixel region, and the edge region is provided with multiple peripheral circuits;

the first light emitting device, the second light emitting device and the third light emitting device are all located in the pixel region, and a first electrode layer of the first light emitting device is coupled to one of the pixel driving circuits;

a second electrode layer of the first light emitting device extends from the pixel region to the edge region, and is coupled to one of the peripheral circuits;

a second electrode layer of the second light emitting device is coupled to another pixel driving circuit; and a second electrode layer of the third light emitting device extends from the pixel region to the edge region, and is coupled to another peripheral circuit.

2. The display panel according to claim 1, wherein each light emitting device comprises:

a first electrode layer, formed on a side of the driving backplane and coupled to one of the pixel driving circuits;

a light emitting functional layer, formed on a surface of the first electrode layer away from the driving backplane; and a second electrode layer, formed on a surface of the light emitting functional layer away from the driving backplane;

wherein among two adjacent light emitting devices in the direction perpendicular to the driving backplane, a second electrode layer of a light emitting device closer to the driving backplane and a first electrode layer of a light emitting device away from the driving backplane are the same electrode layer.

3. The display panel according to claim 2, wherein light emitting materials of the first light emitting device, the second light emitting device and the third light emitting device are different from each other for emitting light of different colors.

4. The display panel according to claim 3, wherein the first light emitting device is a blue light emitting device, the second light emitting device is a green light emitting device, and the third light emitting device is a red light emitting device.

5. The display panel according to claim 3, wherein the first electrode layer of the first light emitting device is disposed on the side of the driving backplane, and the display panel further comprises:

a pixel definition layer, disposed on the same side of the driving backplane as the first electrode layer of the first light emitting device, wherein the pixel definition layer is provided with multiple openings exposing the first electrode layer of each first light emitting device; and wherein a light emitting functional layer of the first light emitting device is at least partially disposed in the opening;

the second electrode layer of the first light emitting device is disposed on a surface of the pixel definition layer away from the driving backplane, an orthographic projection of the second electrode layer of the first light emitting device in the opening and an orthographic projection of the light emitting functional layer of the first light emitting device in the opening are at least partially overlapped, and the second electrode layer of the first light emitting device is coupled to the pixel driving circuit through a via hole penetrating the pixel definition layer;

a surface of the second electrode layer of the first light emitting device away from the driving backplane is covered by a light emitting functional layer of the second light emitting device, and an orthographic projection of the second electrode layer of the first light emitting device on the driving backplane is covered by an orthographic projection of the light emitting functional layer of the second light emitting device on the driving backplane;

surfaces of the light emitting functional layer of the second light emitting device and the pixel definition layer are covered by the second electrode layer of the second light emitting device, an orthographic projection of the second electrode layer of the second light emitting device in the opening and the orthographic projection of the light emitting functional layer of the first light emitting device in the opening are at least partially overlapped, and the second electrode layer of the second light emitting device is coupled to the pixel driving circuit through the via hole penetrating the pixel definition layer;

a light emitting functional layer of the third light emitting device comprises a hole transport layer, a light emitting material layer and an electron transport layer that are stacked in sequence, the hole transport layer is located on a side of a first electrode layer of the third light emitting device away from the driving backplane, and an orthographic projection of the second electrode layer of the second light emitting device on the driving backplane is covered by an orthographic projection of the hole transport layer on the driving backplane; the light emitting material layer is located on a side of the hole transport layer away from the driving backplane, and an orthographic projection of the light emitting material layer in the opening and the orthographic projection of the second electrode layer of the second light emitting device in the opening are at least partially overlapped; and a surface of a structure jointly formed by the light emitting material layer and the hole transport layer is covered by the electron transport layer; and the second electrode layer of the third light emitting device is located on a side of the electron transport layer away from the driving backplane, and an orthographic projection of the second electrode layer of the third light emitting device in the opening and the orthographic projection of the light emitting material layer in the opening are at least partially overlapped.

6. The display panel according to claim 5, wherein third light emitting devices of individual light emitting units share the hole transport layer and the electron transport layer.

7. The display panel according to claim 5, wherein the display panel further comprises:

a light shielding layer, disposed on a side of the light emitting device layer away from the driving backplane, and having multiple light transmitting holes, wherein individual light transmitting holes are disposed in a one-to-one correspondence with individual openings, and an orthographic projection of each light transmitting hole on the driving backplane and an orthographic projection of a light emitting device in an opening corresponding to the light transmitting hole on the driving backplane are at least partially overlapped.

8. The display panel according to claim 1, wherein the display panel further comprises:
   a pixel definition layer, covering at least the pixel region and disposed on the same side of the driving backplane as the first electrode layer of the first light emitting device, wherein the pixel definition layer is provided with multiple openings exposing the first electrode layer of each first light emitting device, respectively;
   a light emitting functional layer of the first light emitting device is disposed on a surface of the pixel definition layer away from the driving backplane, and an orthographic projection of the first electrode layer of the first light emitting device on the driving backplane is within an orthographic projection of the light emitting functional layer of the first light emitting device on the driving backplane;
   the second electrode layer of the first light emitting device is disposed on a surface of the light emitting functional layer of the first light emitting device away from the driving backplane, and the orthographic projection of the light emitting functional layer of the first light emitting device on the driving backplane is within an orthographic projection of the second electrode layer of the first light emitting device on the driving backplane;
   a light emitting functional layer of the second light emitting device is disposed on a surface of the second electrode layer of the first light emitting device away from the driving backplane, and extends at least to the opening;
   the second electrode layer of the second light emitting device is disposed on a surface of the light emitting functional layer of the second light emitting device away from the driving backplane, and an orthographic projection of the second electrode layer of the second light emitting device in the opening and an orthographic projection of the light emitting functional layer of the second light emitting device in the opening are at least partially overlapped;
   a light emitting functional layer of the third light emitting device is disposed on a surface of the second electrode layer of the second light emitting device away from the driving backplane, and an orthographic projection of the second electrode layer of the second light emitting device on the driving backplane is within an orthographic projection of the light emitting functional layer of the third light emitting device on the driving backplane; and
   the second electrode layer of the third light emitting device is disposed on a surface of the light emitting functional layer of the third light emitting device away from the driving backplane, and an orthographic projection of the second electrode layer of the third light emitting device in the opening and the orthographic projection of the second electrode layer of the second light emitting device in the opening are at least partially overlapped.

9. The display panel according to claim 1, wherein light emitting functional layers of first light emitting devices of individual light emitting units are disposed in the same layer and coupled.

10. The display panel according to claim 1, wherein second electrode layers of first light emitting devices of individual light emitting units are disposed in the same layer and coupled.

11. The display panel according to claim 1, wherein light emitting functional layer of second light emitting devices of individual light emitting units are disposed in the same layer and coupled.

12. The display panel according to claim 1, wherein light emitting functional layers of third light emitting devices of individual light emitting units are disposed in the same layer and coupled; and
   second electrode layers of the third light emitting devices of the individual light emitting units are disposed in the same layer and coupled.

13. The display panel according to claim 1, wherein the display panel further comprises:
   an encapsulation layer, located on a side of the light emitting device layer away from the driving backplane.

14. A display device comprising a display panel, wherein the display panel comprises:
   a driving backplane, comprising multiple pixel driving circuits; and
   a light emitting device layer, comprising multiple light emitting units distributed in an array, wherein each light emitting unit comprises multiple light emitting devices stacked in a direction away from the driving backplane, and light emitting devices other than a light emitting device closest to the driving backplane in a direction perpendicular to the driving backplane are transparent devices; and
   wherein in the same light emitting unit, at least part of the light emitting devices are coupled to the pixel driving circuits for emitting light under driving of the pixel driving circuits, and at least two light emitting devices in the same light emitting unit have different light emitting materials,
   wherein the number of light emitting devices in the same light emitting unit is three, comprising a first light emitting device, a second light emitting device and a third light emitting device distributed in the direction away from the driving backplane;
   wherein the driving backplane comprises a pixel region and an edge region located outside the pixel region, each pixel driving circuit is located in the pixel region, and the edge region is provided with multiple peripheral circuits;
   the first light emitting device, the second light emitting device and the third light emitting device are all located in the pixel region, and a first electrode layer of the first light emitting device is coupled to one of the pixel driving circuits;
   a second electrode layer of the first light emitting device extends from the pixel region to the edge region, and is coupled to one of the peripheral circuits;
   a second electrode layer of the second light emitting device is coupled to another pixel driving circuit; and
   a second electrode layer of the third light emitting device extends from the pixel region to the edge region, and is coupled to another peripheral circuit.

15. The display device according to claim 14, wherein each light emitting device comprises:

a first electrode layer, formed on a side of the driving backplane and coupled to one of the pixel driving circuits;

a light emitting functional layer, formed on a surface of the first electrode layer away from the driving backplane; and a second electrode layer, formed on a surface of the light emitting functional layer away from the driving backplane;

wherein among two adjacent light emitting devices in the direction perpendicular to the driving backplane, a second electrode layer of a light emitting device closer to the driving backplane and a first electrode layer of a light emitting device away from the driving backplane are the same electrode layer.

16. The display device according to claim 15, wherein light emitting materials of the first light emitting device, the second light emitting device and the third light emitting device are different from each other for emitting light of different colors.

17. The display device according to claim 16, wherein the first light emitting device is a blue light emitting device, the second light emitting device is a green light emitting device, and the third light emitting device is a red light emitting device.

18. A manufacturing method for a display panel, comprising:

forming a driving backplane comprising multiple pixel driving circuits; and forming a light emitting device layer on a side of the driving backplane, wherein the light emitting device layer comprises multiple light emitting units distributed in an array, each light emitting unit comprises multiple light emitting devices stacked in a direction away from the driving backplane, and light emitting devices other than a light emitting device closest to the driving backplane in a direction perpendicular to the driving backplane are transparent devices;

wherein in the same light emitting unit, at least part of the light emitting devices are coupled to the pixel driving circuits for emitting light under driving of the pixel driving circuits, and at least two light emitting devices in the same light emitting unit have different light emitting materials, wherein the number of light emitting devices in the same light emitting unit is three, comprising a first light emitting device, a second light emitting device and a third light emitting device distributed in the direction away from the driving backplane, the driving backplane comprises a pixel region and an edge region located outside the pixel region, each pixel driving circuit is located in the pixel region, and the edge region is provided with multiple peripheral circuits;

the forming the light emitting device layer on the side of the driving backplane comprises:

forming a pixel definition layer on a surface of the driving backplane, wherein the pixel definition layer covers at least the pixel region and is disposed on the same side of the driving backplane as a first electrode layer of the first light emitting device, and the pixel definition layer is provided with multiple openings exposing the first electrode layer of each first light emitting device, respectively;

forming a light emitting functional layer of the first light emitting device on a surface of the pixel definition layer away from the driving backplane, wherein an orthographic projection of the first electrode layer of the first light emitting device on the driving backplane is within an orthographic projection of the light emitting functional layer of the first light emitting device on the driving backplane;

forming a second electrode layer of the first light emitting device on a surface of the light emitting functional layer of the first light emitting device away from the driving backplane, wherein the orthographic projection of the light emitting functional layer of the first light emitting device on the driving backplane is within an orthographic projection of the second electrode layer of the first light emitting device on the driving backplane, and the second electrode layer of the first light emitting device extends from the pixel region to the edge region, and is coupled to one of the peripheral circuits;

forming a light emitting functional layer of the second light emitting device on a surface of the second electrode layer of the first light emitting device away from the driving backplane, wherein the light emitting functional layer of the second light emitting device extends at least to the opening;

forming a second electrode layer of the second light emitting device on a surface of the light emitting functional layer of the second light emitting device away from the driving backplane, wherein an orthographic projection of the second electrode layer of the second light emitting device in the opening and an orthographic projection of the light emitting functional layer of the second light emitting device in the opening are at least partially overlapped, and the second electrode layer of the second light emitting device is coupled to one of the pixel driving circuits;

forming a light emitting functional layer of the third light emitting device on a surface of the second electrode layer of the second light emitting device away from the driving backplane, wherein an orthographic projection of the second electrode layer of the second light emitting device on the driving backplane is within an orthographic projection of the light emitting functional layer of the third light emitting device on the driving backplane; and forming a second electrode layer of the third light emitting device on a surface of the light emitting functional layer of the third light emitting device away from the driving backplane, wherein an orthographic projection of the second electrode layer of the third light emitting device in the opening and the orthographic projection of the second electrode layer of the second light emitting device in the opening are at least partially overlapped, and the second electrode layer of the third light emitting device extends from the pixel region to the edge region, and is coupled to another peripheral circuit.

* * * * *